(12) United States Patent
Delacruz et al.

(10) Patent No.: US 10,295,588 B2
(45) Date of Patent: May 21, 2019

(54) WAFER TESTING WITHOUT DIRECT PROBING

(71) Applicant: Xcelsis Corporation, San Jose, CA (US)

(72) Inventors: Javier A. Delacruz, San Jose, CA (US); William C. Plants, Campbell, CA (US)

(73) Assignee: Xcelsis Corporation, San Jose, CA (US)

( * ) Notice: Subject to any disclaimer, the term of this patent is extended or adjusted under 35 U.S.C. 154(b) by 323 days.

(21) Appl. No.: 15/388,130

(22) Filed: Dec. 22, 2016

(65) Prior Publication Data

US 2018/0180665 A1 Jun. 28, 2018

(51) Int. Cl.
G01R 31/28 (2006.01)

(52) U.S. Cl.
CPC ..... *G01R 31/2856* (2013.01); *G01R 31/2884* (2013.01); *G01R 31/2894* (2013.01); *G01R 31/2831* (2013.01)

(58) Field of Classification Search
CPC ...... G01R 31/002; G01R 31/00; G01R 31/26; G01R 31/31924; G01R 19/257; G01R 31/2884; G01R 31/3004; G01R 31/3181; G01R 31/31813; G01R 1/06; G01R 1/067; G01R 31/31901; G01R 31/2642; G01R 31/2648; G01R 31/2831; G01R 31/31702; G01R 1/0491; G01R 31/265; G01R 31/3012; G01R 31/318511
USPC ........... 324/537, 750.01, 750.3, 555, 762.01, 324/762.03
See application file for complete search history.

(56) References Cited

U.S. PATENT DOCUMENTS

| | | | |
|---|---|---|---|
| 5,615,216 A * | 3/1997 | Saeki | G06F 11/22 324/523 |
| 5,899,703 A | 5/1999 | Kalter et al. | |
| 6,034,536 A | 3/2000 | McClintock et al. | |
| 6,664,632 B2 | 12/2003 | Duesman et al. | |
| 6,720,652 B2 | 4/2004 | Akram et al. | |
| 6,730,529 B1 | 5/2004 | Kalter et al. | |
| 7,224,042 B1 | 5/2007 | McCollum | |
| 7,358,601 B1 | 4/2008 | Plants et al. | |
| 7,459,772 B2 | 12/2008 | Speers | |
| 7,718,512 B2 | 5/2010 | McCollum | |
| 8,466,702 B2 * | 6/2013 | Watanabe | G01R 31/2889 324/754.07 |
| 8,679,861 B2 | 3/2014 | Bose et al. | |
| 8,680,882 B2 | 3/2014 | Tseng et al. | |
| 8,854,853 B2 | 10/2014 | Chou et al. | |
| 8,890,562 B1 | 11/2014 | Hartanto | |
| 8,913,449 B2 | 12/2014 | Chung | |
| 9,239,359 B2 | 1/2016 | Marinessen et al. | |

(Continued)

OTHER PUBLICATIONS

"3D Integration for MEMs Devices," Invensas Corporation, Nov. 16, 2016, 2 pages.

(Continued)

*Primary Examiner* — Tung X Nguyen
*Assistant Examiner* — Robert P Alejnikov, Jr.

(57) ABSTRACT

The invention pertains to in-wafer testing of integrated circuits. In particular, it pertains to apparatuses and methods for testing small integrated circuits that have pad sizes and pitches that are too small for using conventional wafer probing technology.

8 Claims, 23 Drawing Sheets

(56) References Cited

U.S. PATENT DOCUMENTS

2007/0211932 A1    9/2007  Lee et al.
2009/0201039 A1*   8/2009  Wu ................... G01R 31/3025
                                              324/750.3

OTHER PUBLICATIONS

"Plasma-Therm: Plasma Dicing," printed from web http://plasmatherm.com/wafer-singulation.html, Dec. 21, 2016; 1 page.

* cited by examiner

WAFER TESTING WITHOUT DIRECT PROBING

FIELD OF THE INVENTION

The invention pertains to in-wafer testing of integrated circuits. In particular, it pertains to testing small integrated circuits (called "chiplets") that have connection points and pitches that are too small for using conventional direct probing technology.

BACKGROUND OF THE INVENTION

Semiconductor fabrication technology is well known in the art. FIG. 1A illustrates a conventional semiconductor wafer 100 comprising a plurality of product integrated circuit die sites arranged in rows and columns, an exemplary one being indicated at 102. Typically, a few product integrated circuit sites are sacrificed for process monitoring sites, an exemplary one being indicated at 104. In this case, five are shown: one near the center and the others near the center of each quadrant of the wafer. These sites typically comprise test transistors, layer minimum width and spacing structures (also known as critical dimension or CD structures), and the like to enable the foundry to characterize its process and enhance yields.

FIG. 1B shows the conventional wafer 100 with the mask reticle locations overlaid, an exemplary one being indicated at 106. Masks are used in the photo-lithographic process to construct the various individual layers that are used to fabricate the devices and interconnects comprising the product integrated circuits formed at their respective sites 102.

Typically, multiple instances of the product integrated circuits are present in the mask reticle. For each mask layer, the wafer 100 is covered with photoresist. The mask reticle is stepped over the wafer, stopping at each mask reticle location 106, where a light source of a desired frequency is flashed through the mask and onto the wafer. This develops the photoresist to define the shapes and spaces for that layer. This process is repeated for each mask reticle location 106 until the photoresist on the entire wafer has been developed.

Subsequent processing selectively removes the developed (or the undeveloped) patterns in the photoresist, leaving behind the desired shapes and spaces, which in turn are further processed to create the microscopic structures comprising the product integrated circuit die. This process is repeated for each mask layer in the fabrication process.

Thus the mask reticle sites 106 shown in FIG. 1B are an abstraction that maps the desired mask reticle locations. They are not visible on the finished wafer 100. Further, the checkerboard pattern of shading has no physical basis, and is present only to indicate the mask reticle locations in the middle of the wafer in an unobtrusive way.

FIG. 1C illustrates an enlarged portion of the conventional wafer 100 and mask reticle locations 106, including a blow-up of an exemplary conventional product integrated circuit die 108 fabricated at a particular conventional product integrated circuit die site 110. Typically, all of the conventional product integrated circuit dies formed at sites 102 are the same circuit, but this may not always be the case.

Exemplary conventional product integrated circuit 108 comprises a variety of sub-circuits that might be suitable for use in a multi-core processor targeted for a data center or enterprise level server or other high performance computing product, though the principles apply to integrated circuits suitable for many applications. Present in integrated circuit 108 are four central processing units (labeled CPU) and their associated cache memories (labeled Cache), two phase-locked loops (labeled PLL) for clock generation, four Peripheral Component Interconnect Express controllers (labeled PCIe) for interconnections to various external devices such as network interfaces, mass storage, and the like, and a power management circuit (labeled PM) for controlling five voltage regulators (labeled VR).

FIG. 2A illustrates a conventional product integrated circuit 200 targeted at an application similar to the one of conventional product integrated circuit 108 of FIG. 1C. In integrated circuit 200, the PLL, the PM, and the VR blocks have been removed, and the remaining CPU, Cache and PCIe blocks have been resized and rearranged to form a more compact circuit with a smaller die size.

FIG. 2B illustrates the conventional product integrated circuit 200 of FIG. 2A with the removed sub-circuits present as chiplets mounted upon and electrically connected to it by means of, for example, a face-to-face (F2F) or through-silicon-via (TSV) interconnect technology known in the art. The advantages of this approach are not only a smaller integrated circuit 200, but possibly a smaller package as well occupying less printed circuit board (PCB) space. Additionally, the chiplets may each be manufactured by a different foundry in a different technology—different both from each other and from the integrated circuit 200. Thus each chiplet can be optimized for its particular function regardless of the technology driving the main product integrated circuit 200. Since the chiplets are smaller, many more of them can be fabricated on a single wafer with a higher yield per chiplet due to the reduced effect of random defects.

FIG. 2C illustrates the conventional product integrated circuit 200 prior to mounting the PLL, the PM, and the VR chiplets. It shows the pad locations; an exemplary external bond pad being indicated at 208. The dotted line rectangles show outlines of the locations of the chiplets when they are attached: locations 202A and 202B for the PLL chiplets, locations 204A through 204E for the VR chiplets, and location 206A for the PM chiplet. The pads inside the dotted line rectangles are for the F2F or TSV connections to the chiplets. The dotted line rectangles themselves are illustrative only and are not physically present on conventional product integrated circuit 200.

The smallest standard pad pitch for probe testing is about 20 micro-meters (or microns) and the size of many chiplets will be limited by the pad pitch (instead of the functional circuitry), thus increasing their cost. Smaller pitch interconnect technologies are known in the art like, for example, Direct Bond Interconnect (DBI®) from Ziptronix, Inc. and Invensas Corporation which attaches chiplets to wafers by means of a room temperature dielectric bonding technology followed by low temperature annealing. During the anneal, metal present at or just below the dielectric bond material on both sides of the bond will expand slightly thus creating a reliable electrical connection. This technology is typically employed with an interconnect pad pitch of three microns to six microns, has been proven at 1.6 microns, and has the potential to scale to below one micron.

Once the chiplets have been attached to integrated circuit 200, it can be tested using conventional techniques much as those that would be employed to test conventional product integrated circuit 108. If a defective chiplet were to be attached to integrated circuit 200 the entire assembly including the chiplets might need to be scrapped, so there is a need for testing the chiplets before they can be mounted on integrated circuit 200.

Since the chiplets are directly attached to integrated circuit 200 without a package, they must be tested before the wafer sawing or plasma dicing step which separates them into individual chiplets. (Plasma dicing is analogous to plasma etching used to make trenches on the surface of an integrated circuit, except the trenches are deep enough to singulate the chiplets.) The reduced pad pitch and fragility of the smaller pads make this challenging. At best a fraction of the pads could be probed at one time limiting test coverage, and the probes would damage the contacted pads sufficiently that the wafer would need to be returned to the fab for further processing to repair the surface damage across the entire wafer. This approach is undesirable since it significantly increases the manufacturing cost of the chiplets.

DETAILED DESCRIPTION OF THE INVENTION

Those of ordinary skill in the art will realize that the following figures and descriptions of exemplary embodiments and methods of the present invention are illustrative only and not in any way limiting. Other embodiments will readily suggest themselves to such skilled persons after reviewing this disclosure.

Figure 1A:
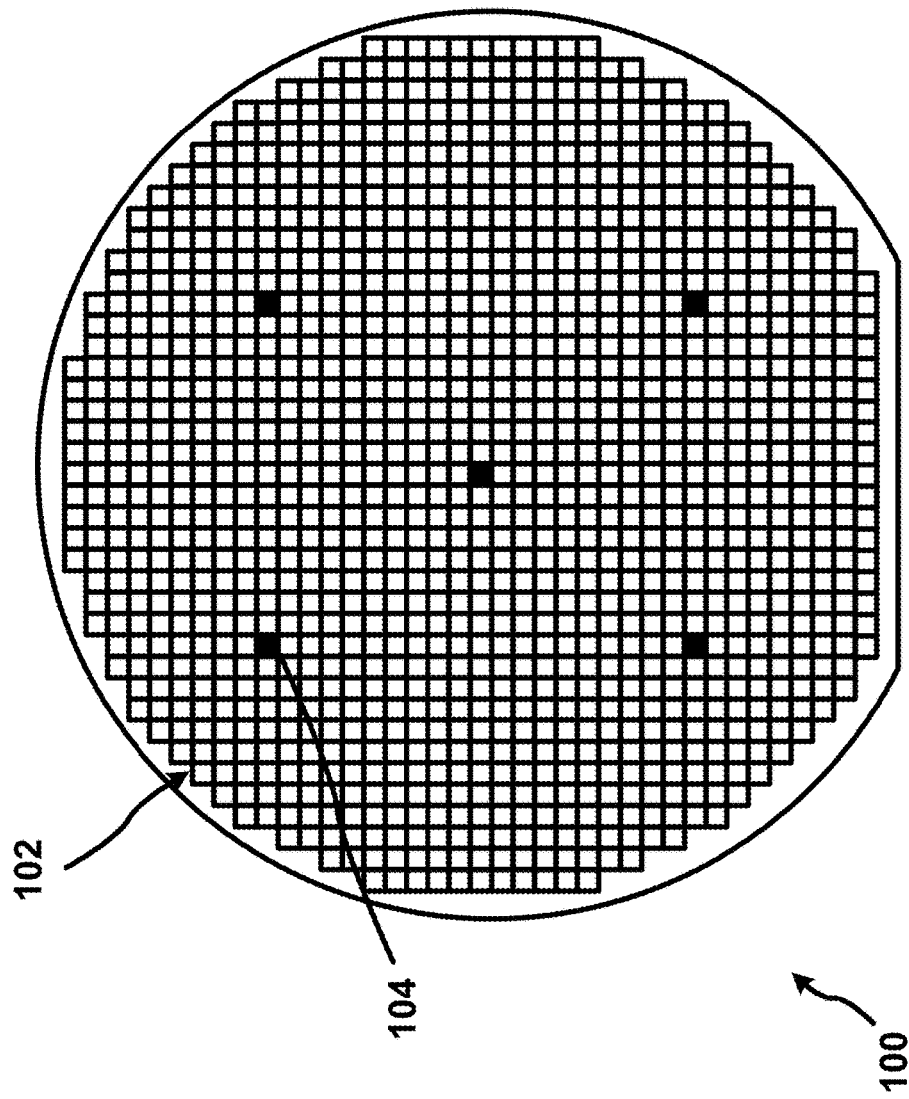
FIG. 1A illustrates a conventional semiconductor wafer.
Figure 1B:
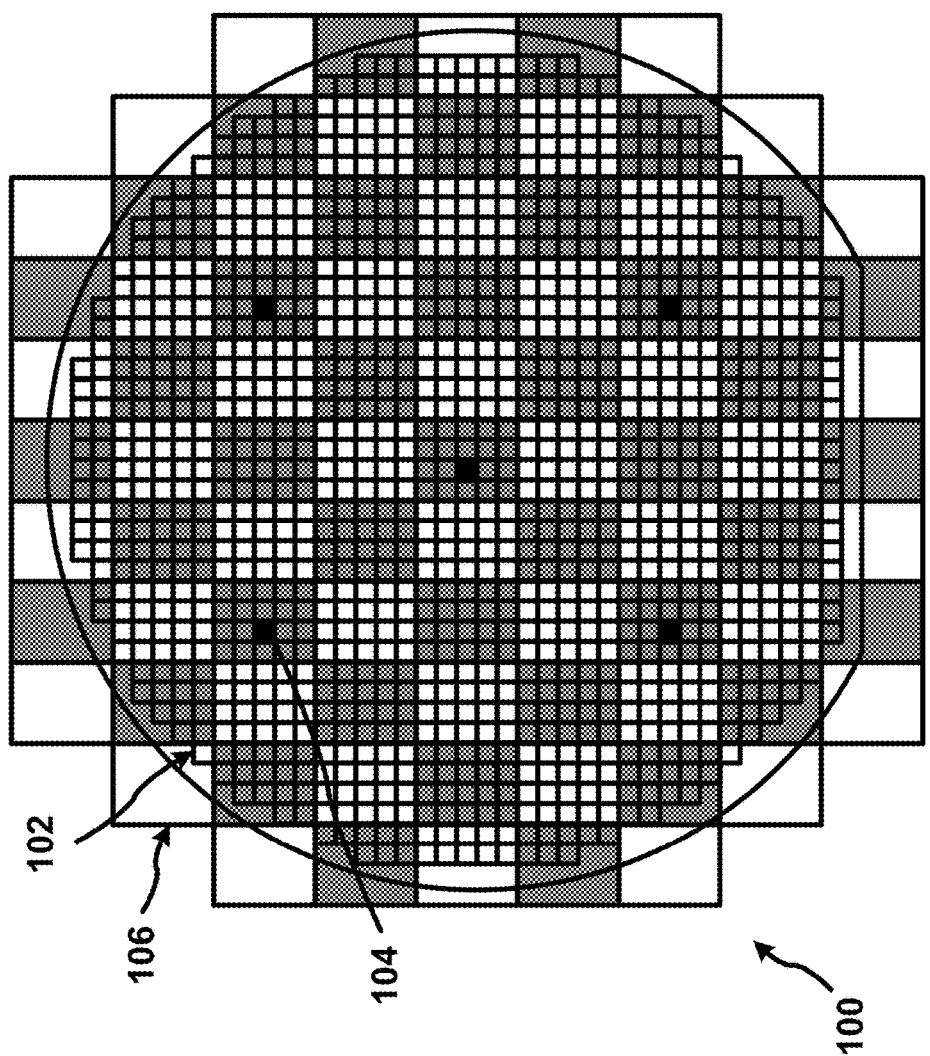
FIG. 1B illustrates the conventional semiconductor wafer of FIG. 1A with mask reticle locations shown.
Figure 1C:
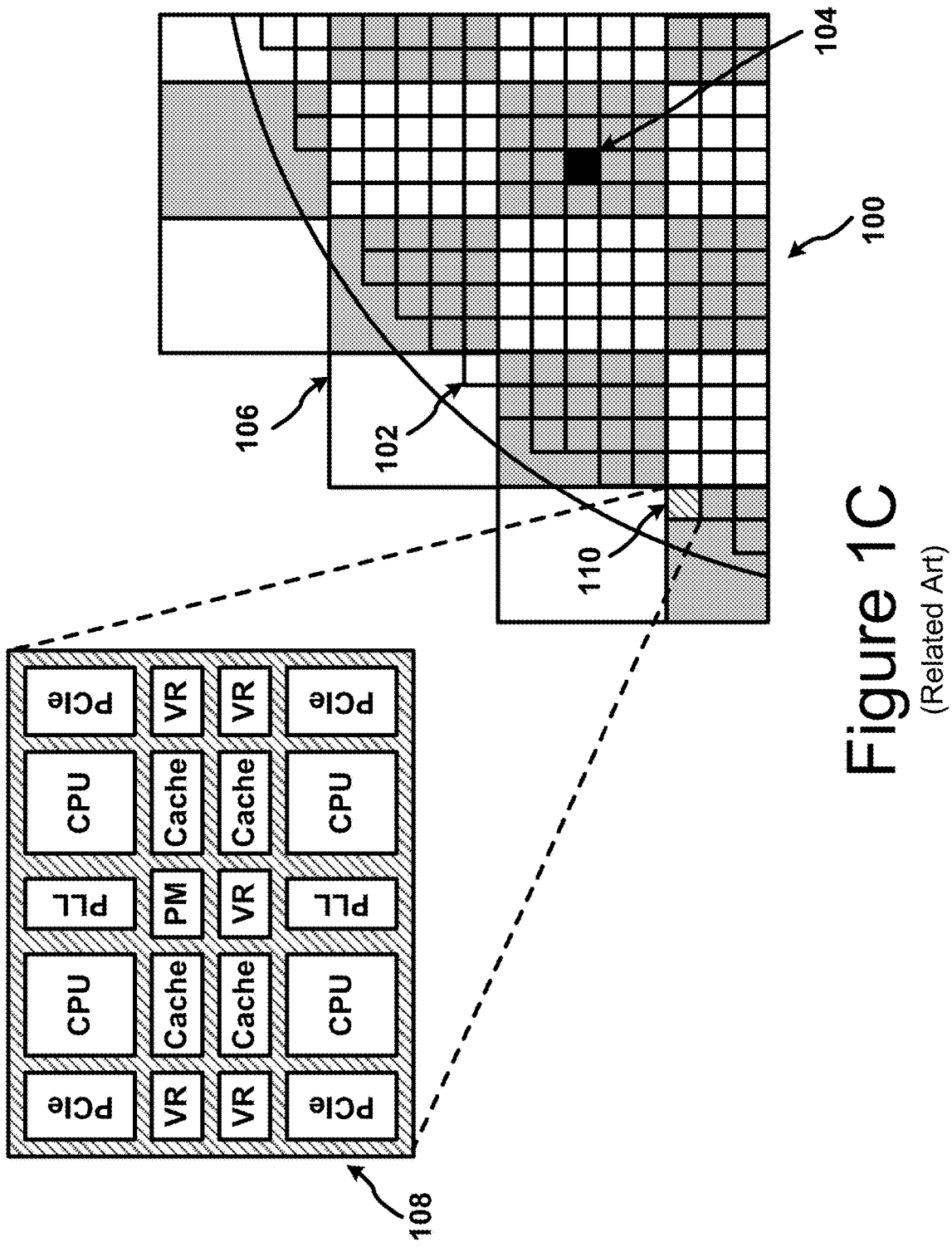
FIG. 1C illustrates a portion of the conventional wafer and mask reticle locations of FIGS. 1A and 1B in more detail including a blow-up of a conventional product integrated circuit die.
Figure 2B:
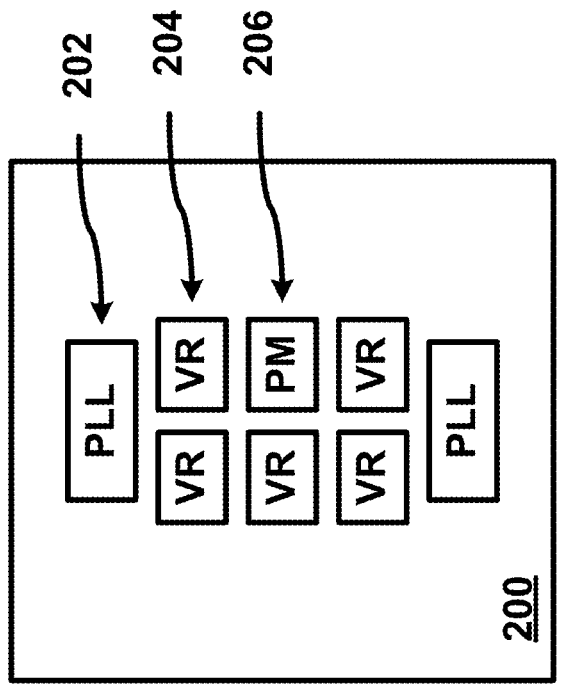
FIG. 2B illustrates the conventional product integrated circuit of FIG. 2A with the removed sub-circuits present as chiplets mounted upon it.
Figure 2A:
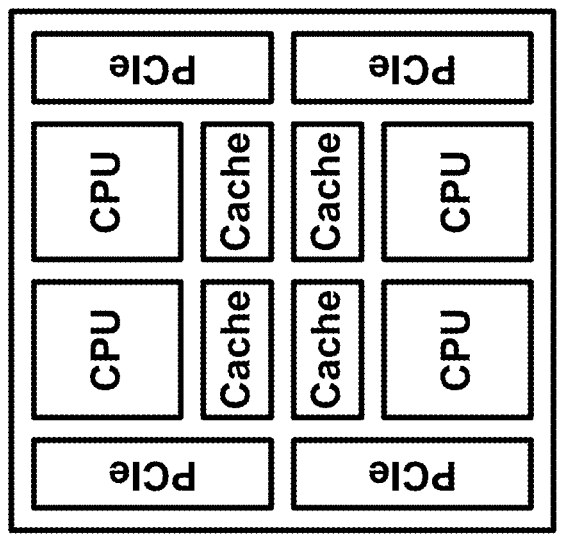
FIG. 2A illustrates a conventional product integrated circuit die targeted at a similar application as the conventional product integrated circuit of FIG. 1C with a plurality of sub-circuits removed.
Figure 2C:
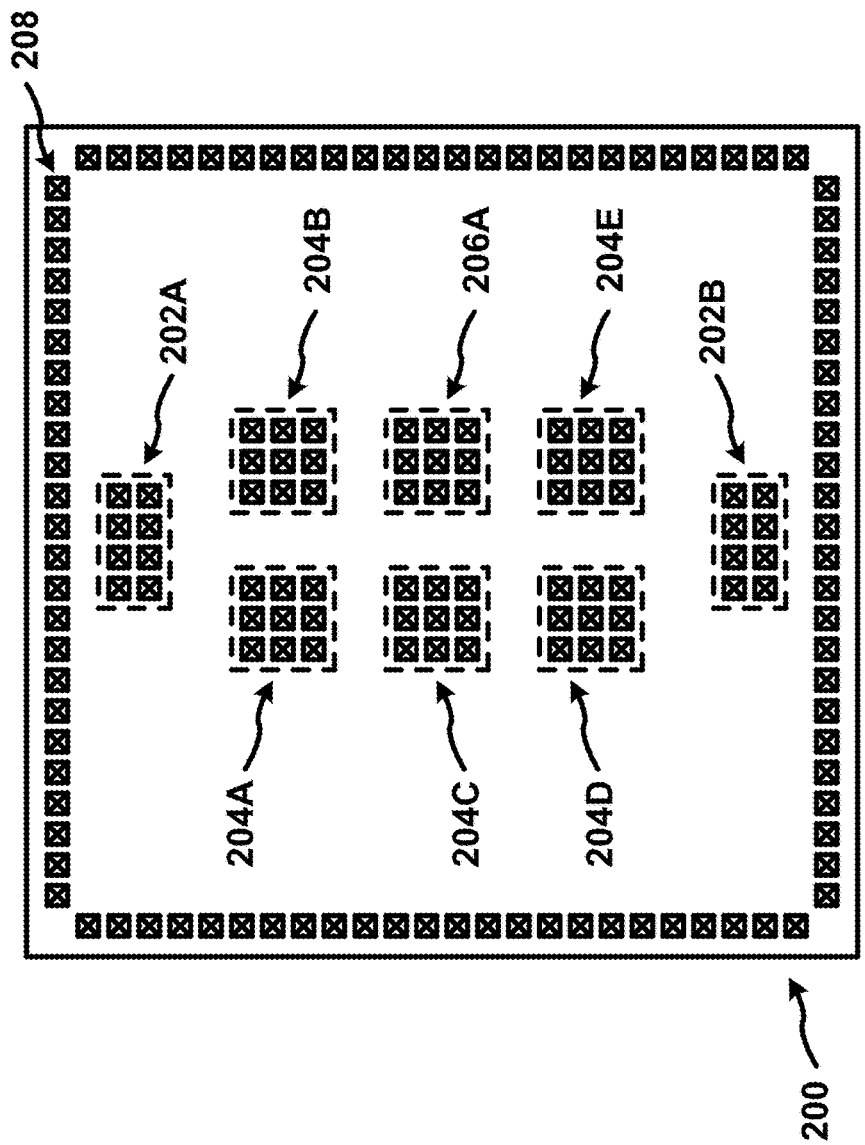
FIG. 2C illustrates the conventional product integrated circuit of FIGS. 2A and 2B showing the pad locations.
Figure 3A:
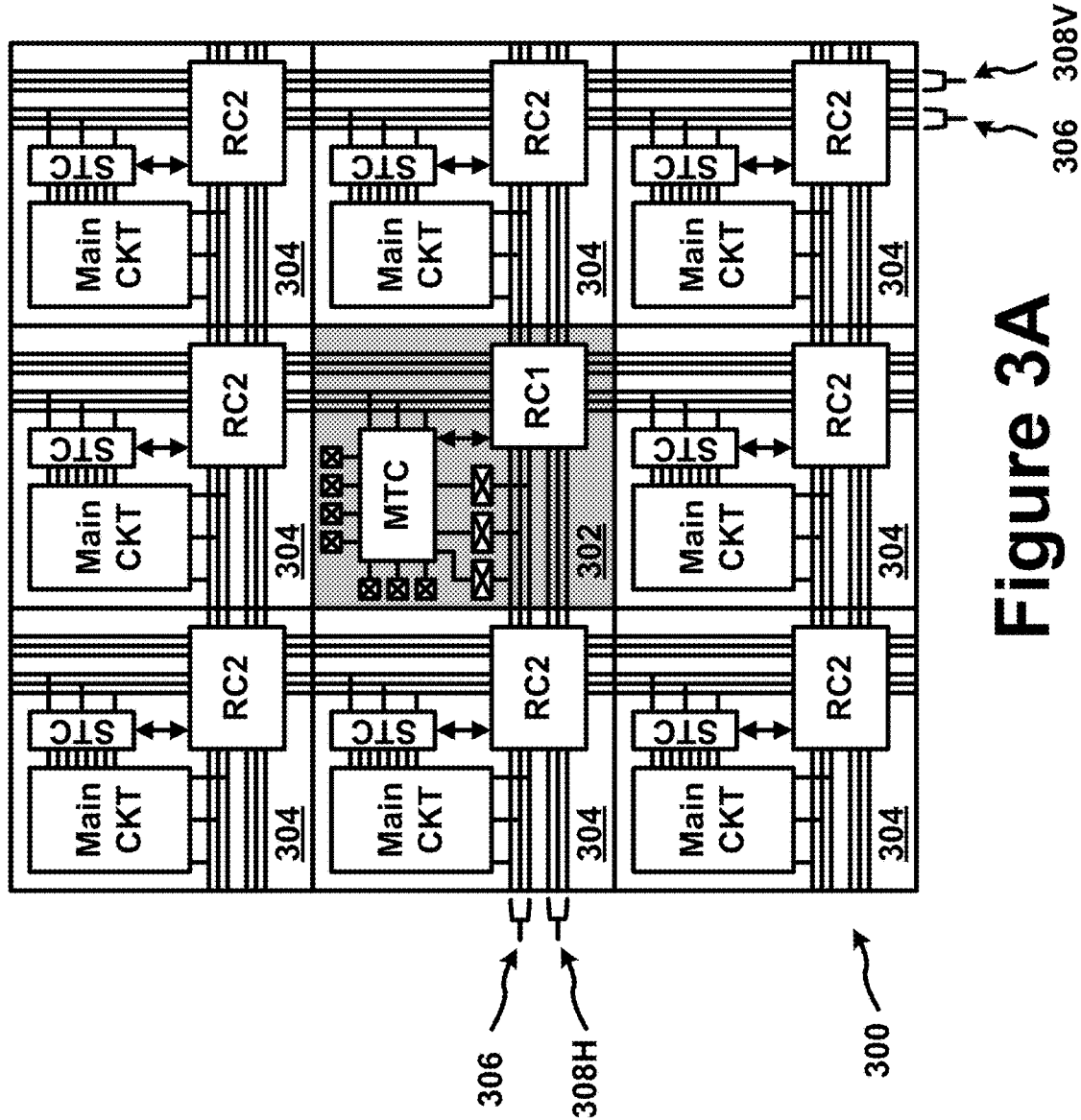
FIG. 3A illustrates a portion of an integrated circuit wafer with integrated circuit die locations according to an embodiment of the present invention.

FIG. 3A illustrates a portion of an integrated circuit wafer 300 with integrated circuit (IC) die locations according to an embodiment of the present invention. Test integrated circuit die 302 is a sacrificial die used for in-wafer testing and is discarded after the wafer is scribed into individual dies. Product integrated circuit dies 304 (the chiplet product dies) have F2F or W2W connection points too delicate with pitches too small to be tested by directly probing them. Test IC 302 is probed using conventional wafer probe technology. Functional product ICs 304 are identified at wafer sorting and then used after the wafer is scribed, while the non-functional ones are discarded.

Preferably, test IC die 302 comprises one or more IC die locations and each product IC die 304 occupies a single IC die location. Test IC die 302 is coupled to adjacent product IC dies 304 by power busses 306. Although three signals are shown in this and other figures, the exact number of conductors is determined as a matter of design choice in any particular embodiment. For example, in many cases only two power supply levels (corresponding to power $[V_{DD}]$ and ground $[V_{SS}]$) will be needed in power busses 306. In other embodiments there may be programmable elements in the product IC dies 304 and a third programming supply voltage $[V_{PP}]$ may be needed. Other embodiments might require other numbers or types of power busses 306 depending on the application. Power busses 306 run straight through test IC die 302 and product IC dies 304 forming a cross shaped topology that connects to the power busses 306 in adjacent dies. In an array, these cross shaped conductors combine to provide a mesh structure for the distribution of each supply voltage. This will be further discussed in conjunction with FIG. 3H.

Test IC die 302 is further coupled to adjacent product IC dies 304 by signal busses 308H and 308V. Although three signals are shown in this and other figures, the exact number of conductors may be different is determined as a matter of design choice in any particular embodiment. For example, if a JTAG standard testing scheme is used four conductors may be required. If a I²C, I³C, SPI, a single wire scheme, etc., serial bus scheme is used, the number of conductors will be chosen as appropriate for the application. In general, signal busses 308H run horizontally and signal busses 308V run vertically. While power busses 306 pass through test IC die 302 and product IC dies 304, the signal busses 308H and 308V typically have a span of only one IC die location.

Figure 3B:
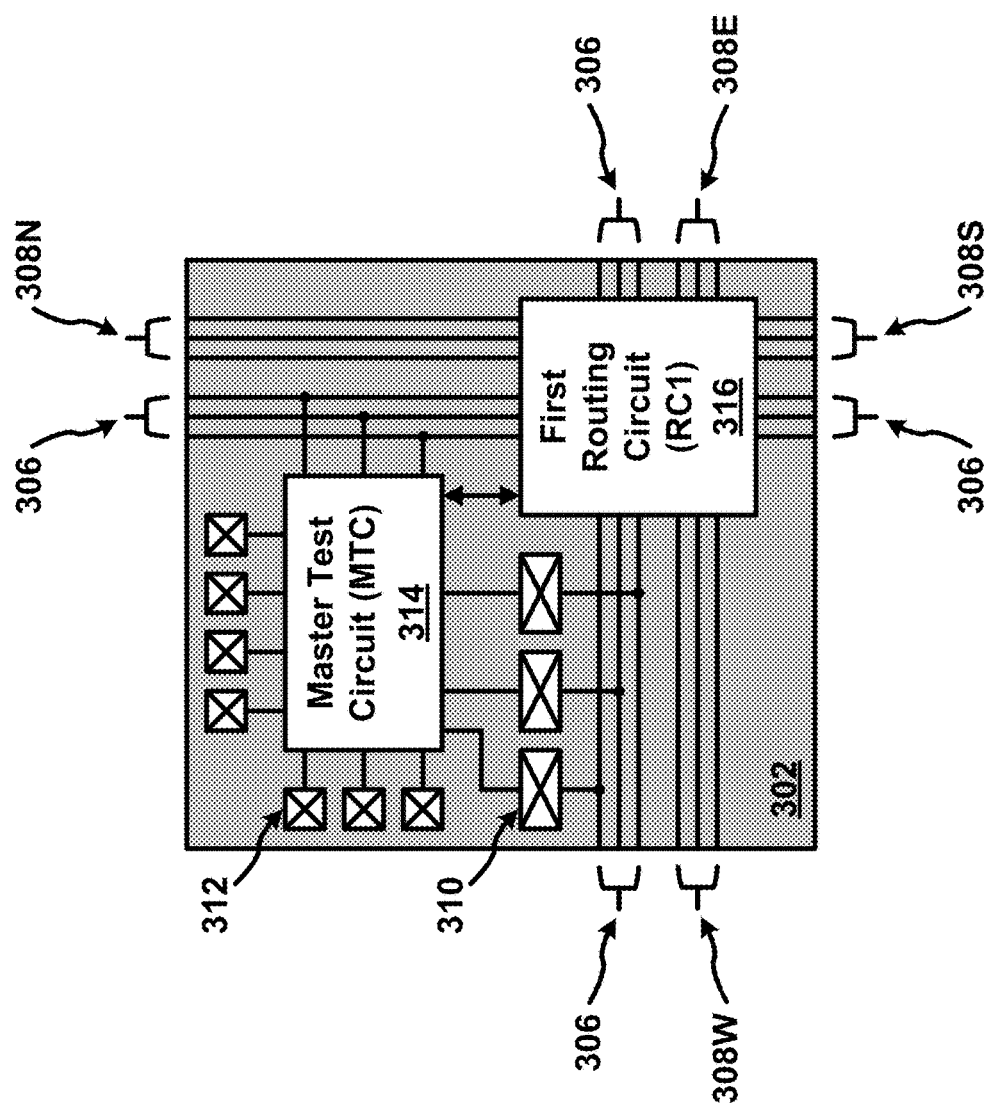
FIG. 3B illustrates a test integrated circuit die according to an embodiment of the present invention.

FIG. 3B illustrates more detail with respect to test integrated circuit die 302, which further comprises a plurality of power probe pads 310, signal probe pads 312, master test circuit 314, and first routing circuit 316.

Power probe pads 310 are each coupled to one of power busses 306 and each is further coupled to master test circuit 314 and first routing circuit 316. Power probe pads 310 appear as double probe sized pads in FIG. 3B, but they may be sized to accommodate a different number of probes. Signal probe pads 312 are each coupled to master test circuit 314. This allows MTC 314 to communicate with an external tester (not shown) by means of a probe card (not shown) when probes are connected to power probe pads 310 and signal probe pads 312.

Master test circuit 314 is preferably a logic circuit controlled by the external tester. Before it can test the logical functionality of a product IC die 304 it must establish communication with it. This is done by properly controlling first routing circuit 316. Routing circuit 316 is coupled to four different signal busses: 308N, 308E, 308S and 308W. These are coupled to the second routing circuit RC2 present in the nearest neighbor product IC dies 304 towards the north, east, south and west sides respectively of test IC die 302.

Figure 3C:
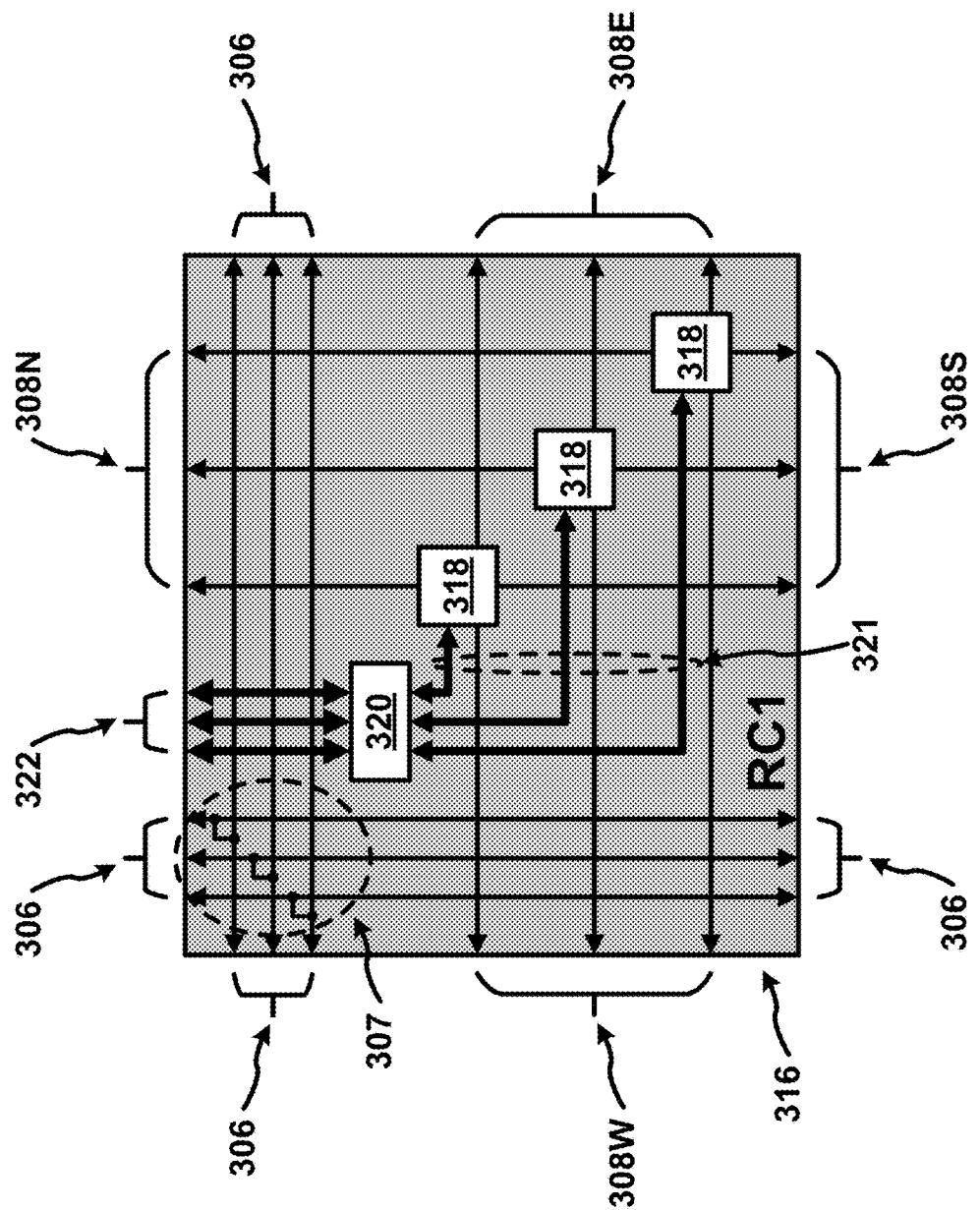
FIG. 3C illustrates a first routing circuit according to an embodiment of the present invention.

FIG. 3C illustrates more detail of the first routing circuit 316. Present in the diagram are power busses 306, signal busses 308N, 308E, 308S and 308W, switch boxes 318, interface logic 320, external connection busses 321, and internal connection busses 322.

As previously discussed, each power bus 306 comprises a north-south segment and an east-west segment electrically coupled together as shown at intersections 307. The power busses 306 are also coupled to the switch boxes 318 and the interface logic 320, though these connections are omitted in FIG. 3C to avoid overcomplicating the diagram.

Each of the signal bus lines 308N, 308E, 308S and 308W is coupled to a single switch box 318. Before wafer sawing or plasma dicing, signal bus line 308N is coupled to the signal bus line 308S of the product integrated circuit die 304 immediately to the north (not shown), signal bus line 308E is coupled to the signal bus line 308W of the product integrated circuit die 304 immediately to the east (not shown), signal bus line 308S is coupled to the signal bus line 308N of the product integrated circuit die 304 immediately to the south (not shown), and signal bus line 308W is coupled to the signal bus line 308E of the product integrated circuit die 304 immediately to the west (not shown).

Each switch box comprises four digital routing buffers (not shown but further discussed in conjunction with FIG. 3F) which allows each signal bus 308 to drive an output signal based on an input signal from any of the other three associated signal busses 308 coupled to that switch box 318. When properly programmed, this allows signals to be routed from test IC die 302 through various product IC dies 304 and back to test IC die 302.

Interface logic 320 is coupled to the switch boxes 318 by external connection busses 321 and to master test circuit 314 by internal connection busses 322. Internal connection busses 322 are "internal" in the sense that all signals on them are internal to test IC 302, while external connection busses 321 are "external" in the sense that that is how test IC die 302 communicates with "external" the product IC dies 304 via interface logic 320.

Figure 3D:
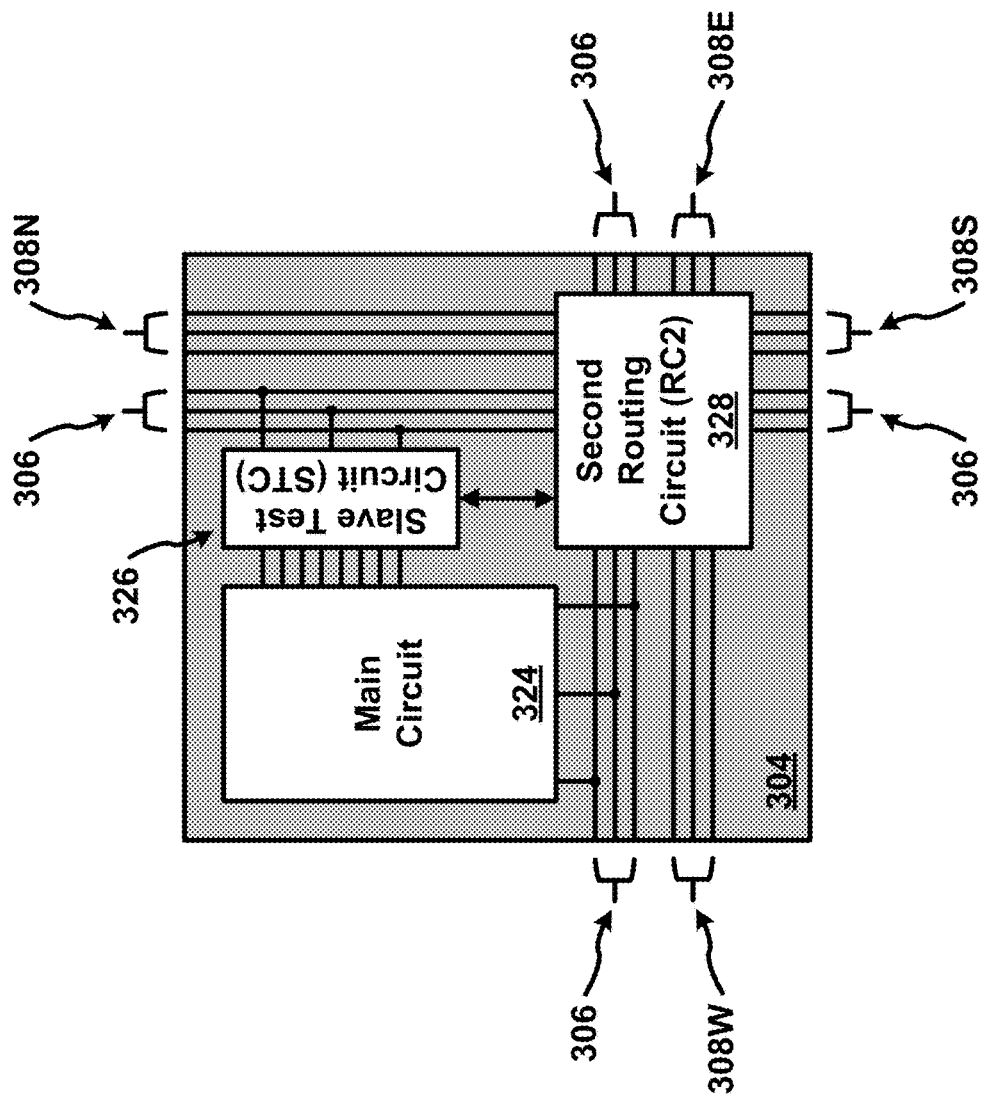
FIG. 3D illustrates a product integrated circuit die according to an embodiment of the present invention.

FIG. 3D illustrates more detail with respect to product integrated circuit die 304, which comprises power busses 306, signal busses 308N, 308E, 308S and 308W, main circuit 324, slave test circuit 326, and second routing circuit 328. Main circuit 324 comprises the product functionality that is being tested prior to the wafer being scribed. Slave test circuit 326 comprises the special circuitry needed to interface between the master test circuit 314 on test IC die 302 and the main circuit 324 on product IC die 304. Second routing circuit 328 is very similar to first routing circuit 316 in that it allows programmable routing between product IC dies 304 and test IC die 302.

Figure 3E:
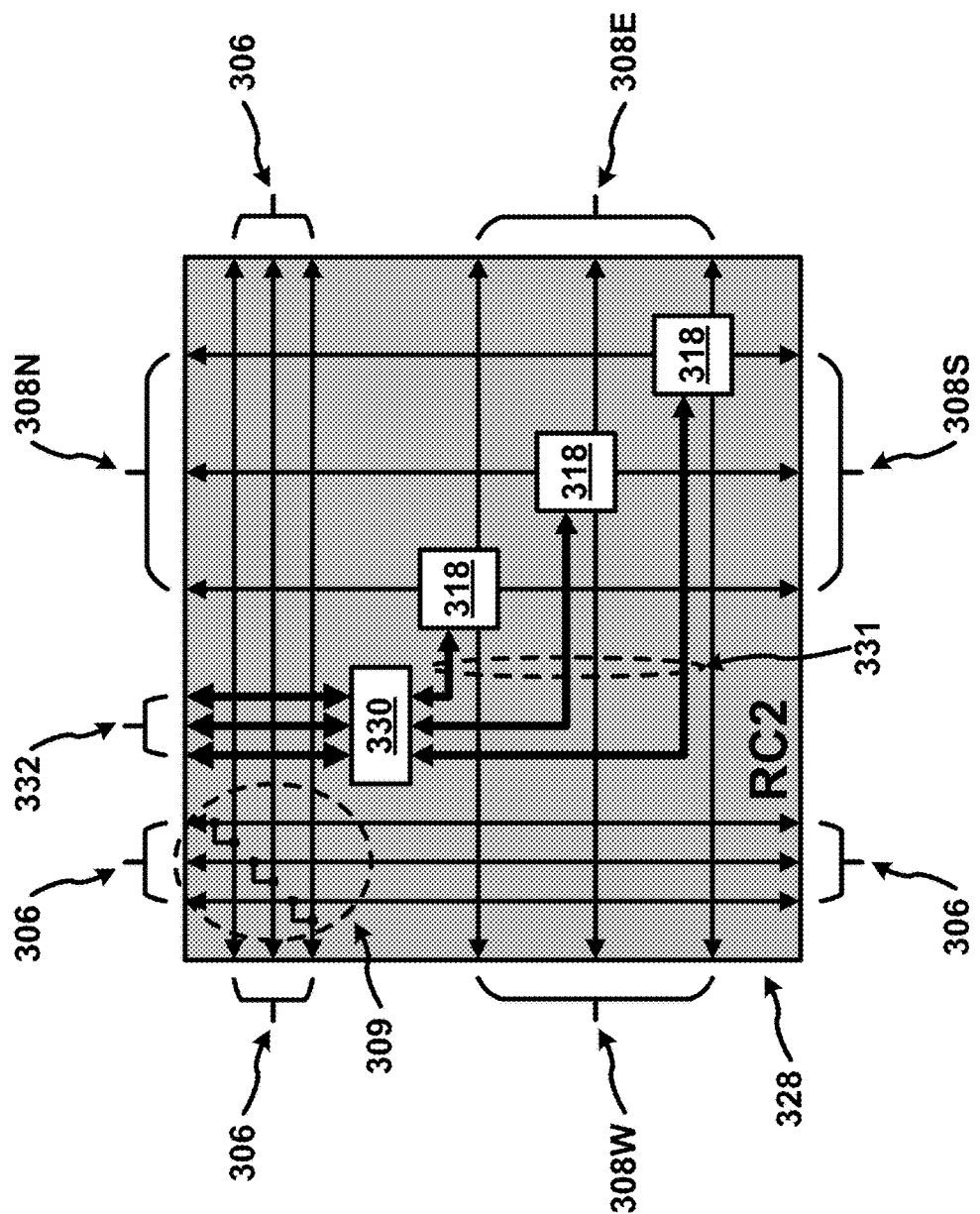
FIG. 3E illustrates a second routing circuit according to an embodiment of the present invention.

FIG. 3E illustrates more detail of second routing circuit 328, which comprises power busses 306, signal busses 308N, 308E, 308S and 308W, switch boxes 318, interface logic 330, external connection busses 331, and internal connection busses 332.

As previously discussed, each power bus 306 comprises a north-south and an east-west segment electrically coupled together as shown at intersections 309. The power busses 306 are also coupled to the switch boxes 318 and the interface logic 330, though these connections are omitted in FIG. 3E to avoid overcomplicating the diagram.

Each of the three signal bus lines 308N, 308E, 308S, and 308W is coupled to a single switch box 318. Other numbers of signal bus lines 308 and switch boxes 318 may be used as a matter of design choice. Before wafer scribing, signal bus line 308N is coupled to the signal bus line 308S of the integrated circuit die (302 or 304) immediately to the north (not shown), signal bus line 308E is coupled to the signal bus line 308W of the integrated circuit die (302 or 304) immediately to the east (not shown), signal bus line 308S is coupled to the signal bus line 308N of the integrated circuit die (302 or 304) immediately to the south (not shown), and signal bus line 308W is coupled to the signal bus line 308E of the integrated circuit die (302 or 304) immediately to the west (not shown).

Each switch box comprises four digital routing buffers (not shown but further discussed in conjunction with FIG. 3F) which allows each signal bus 308 to drive an output signal based on an input signal from any of the other three associated signal busses 308 coupled to that routing buffer. When properly programmed, this allows signals to be routed from test IC die 302 through various product IC dies 304 and back to test IC die 302.

Interface logic 330 is coupled to the switch boxes 318 by external connection busses 331 and to slave test circuit 326 by internal connection busses 332. Internal connection busses 332 are "internal" in the sense that all signals on them are internal to product IC 304, while external connection busses 321 are "external" because that is how product IC die 304 communicates with test IC die 302 via interface logic 330.

Figure 3F:
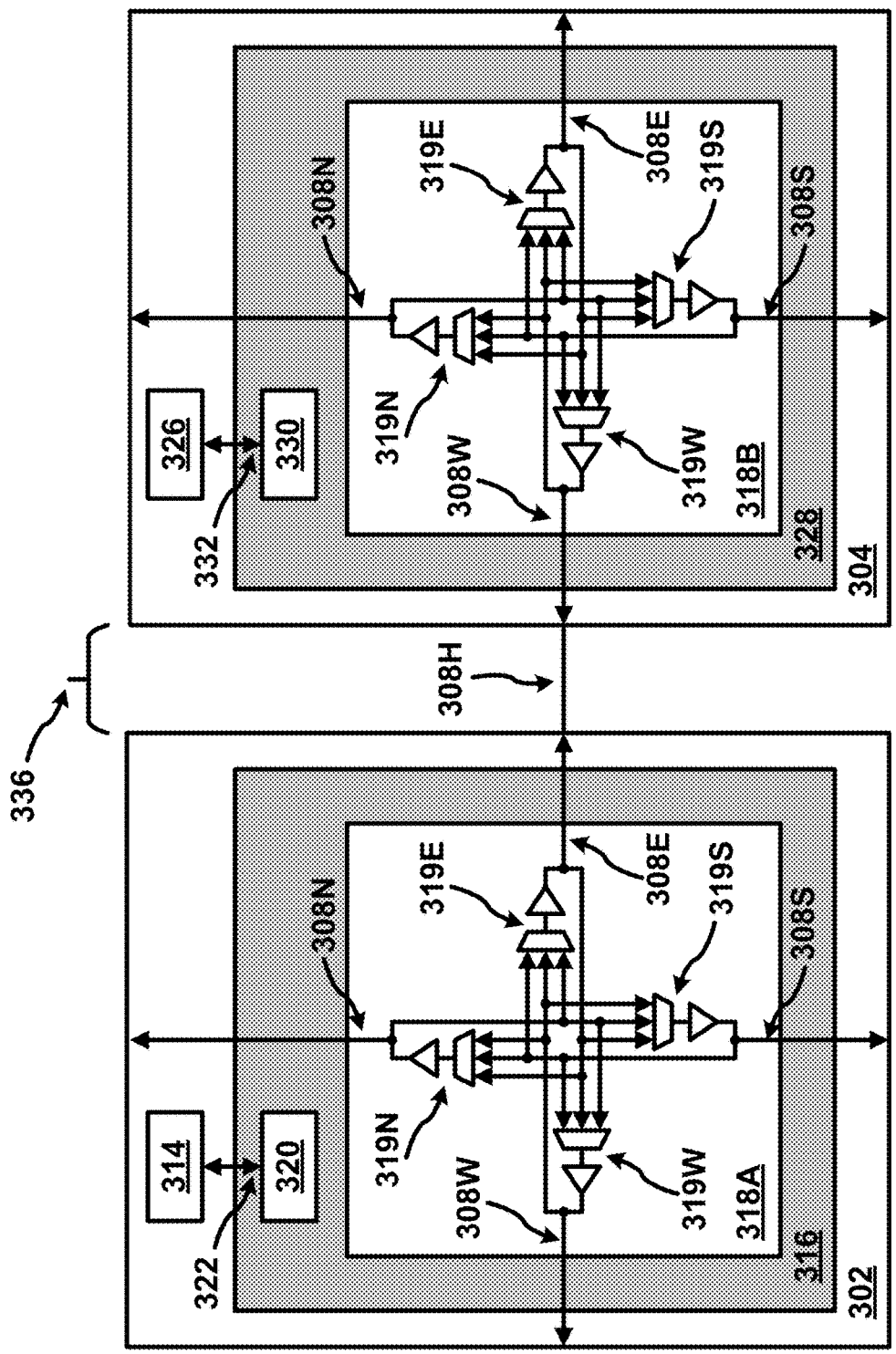
FIG. 3F illustrates two coupled switching elements according to an embodiment of the present invention.

FIG. 3F illustrates more detail with regards to the operations of switch boxes 318. In the figure, an exemplary test IC die 302 is shown coupled to an exemplary product IC die 304 adjacent to its east side. Test IC die 302 further comprises main test circuit 314 coupled to first routing circuit 316 by means of internal connection busses 322 to interface logic 320. An exemplary switch box 318 is shown internal to first routing circuit 316.

An exemplary switch box 318A is shown with four routing buffers 319N, 319E, 319S, and 319W coupled to signal bus lines 308N, 308E, 308S, and 308W respectively. Each routing buffer 319 comprises a multiplexer and a tri-state buffer. For example, the routing buffer 319N can drive signal bus 308N by means of the tri-statable buffer when it is enabled. The signal to be driven may come from signal busses 308E, 308S and 308W as selected by the multiplexer.

External connection busses 321 are present but not shown in FIG. 3F to avoid overcomplicating the diagram. External connection busses 321 perform a number of functions like, for example, monitoring signal traffic on the signal bus lines 308N, 308E, 308S, and 308W, enabling or disabling the tri-state buffers, and selecting the channels on the multiplexers. In some embodiments, the multiplexers may have another channel to output a signal from interface logic 320. Alternatively, interface logic 320 may drive one of the signal busses 308 directly bypassing routing buffers 319 altogether. Such implementation decisions are a matter of design choice in any particular embodiment or application.

Product IC die 304 further comprises slave test circuit 326 coupled to second routing circuit 328 by means of internal connection busses 332 to interface logic 330. An exemplary switch box 318 is shown internal to second routing circuit 328.

A second exemplary switch box 318B is shown with four routing buffers 319N, 319E, 319S, and 319W coupled to signal bus lines 308N, 308E, 308S, and 308W respectively. Each routing buffer 319 comprises a multiplexer and a tri-state buffer. For example, the routing buffer 319N can drive signal bus 308N by means of the tri-statable buffer when it is enabled. The signal to be driven may come from signal busses 308E, 308S and 308W as selected by the multiplexer.

External connection busses 331 are present but not shown in FIG. 3F to avoid overcomplicating the diagram. External connection busses 331 perform a number of functions like, for example, monitoring signal traffic on the signal bus lines 308N, 308E, 308S, and 308W, enabling or disabling the tri-state buffers, and selecting the channels on the multiplexers. In some embodiments, the multiplexers may have another channel to output a signal from interface logic 330. Alternatively, interface logic 330 may drive one of the signal busses 308 directly bypassing routing buffers 319 altogether. Such implementation decisions are a matter of design choice in any particular embodiment or application.

Signal bus line 308E in test IC die 302 is coupled to signal bus line 308W in product IC die 304 by means of a horizontal signal bus line 308H. Horizontal signal bus line 308H crosses vertical scribe line 336. FIG. 3F is not to scale, and horizontal scribe line 336 will be much smaller than the horizontal distance of test IC die 302 and product IC die 304.

Figure 3G:
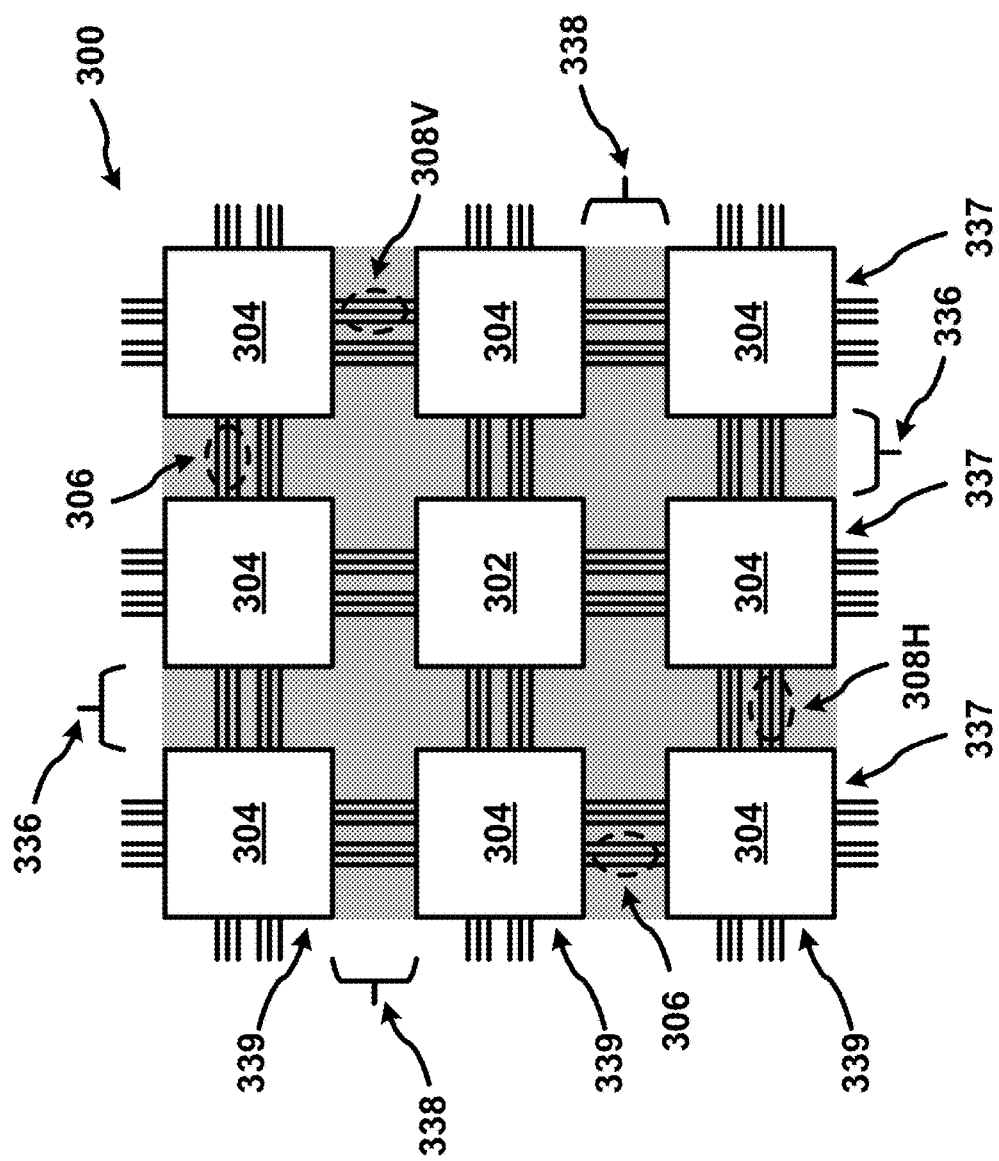
FIG. 3G illustrates a portion of an integrated circuit wafer with integrated circuit die locations and scribe lines according to an embodiment of the present invention.

FIG. 3G illustrates the portion of integrated circuit wafer 300 shown in FIG. 3A featuring vertical scribe lines 336, horizontal scribe lines 338, and inter-die connections, specifically power busses 306 and signal busses 308H and 308V. The array of IC die locations comprises a plurality of columns 337 and a plurality of rows 339. Between each pair of columns 337 is a vertical scribe line 336. Power busses 306 and signal busses 308H cross vertical scribe lines 336 coupling horizontally adjacent IC die locations. Similarly, between each pair of rows 339 is a horizontal scribe line 338. Power busses 306 and signal busses 308V cross horizontal scribe lines 336 coupling vertically adjacent IC die locations. FIG. 3G is not drawn to scale and the widths of the vertical scribe lines 336 and horizontal scribe lines 338 are much smaller than the dimensions of the test IC die 302 and the product IC dies 304 in both the horizontal and vertical directions respectively.

Figure 3H:
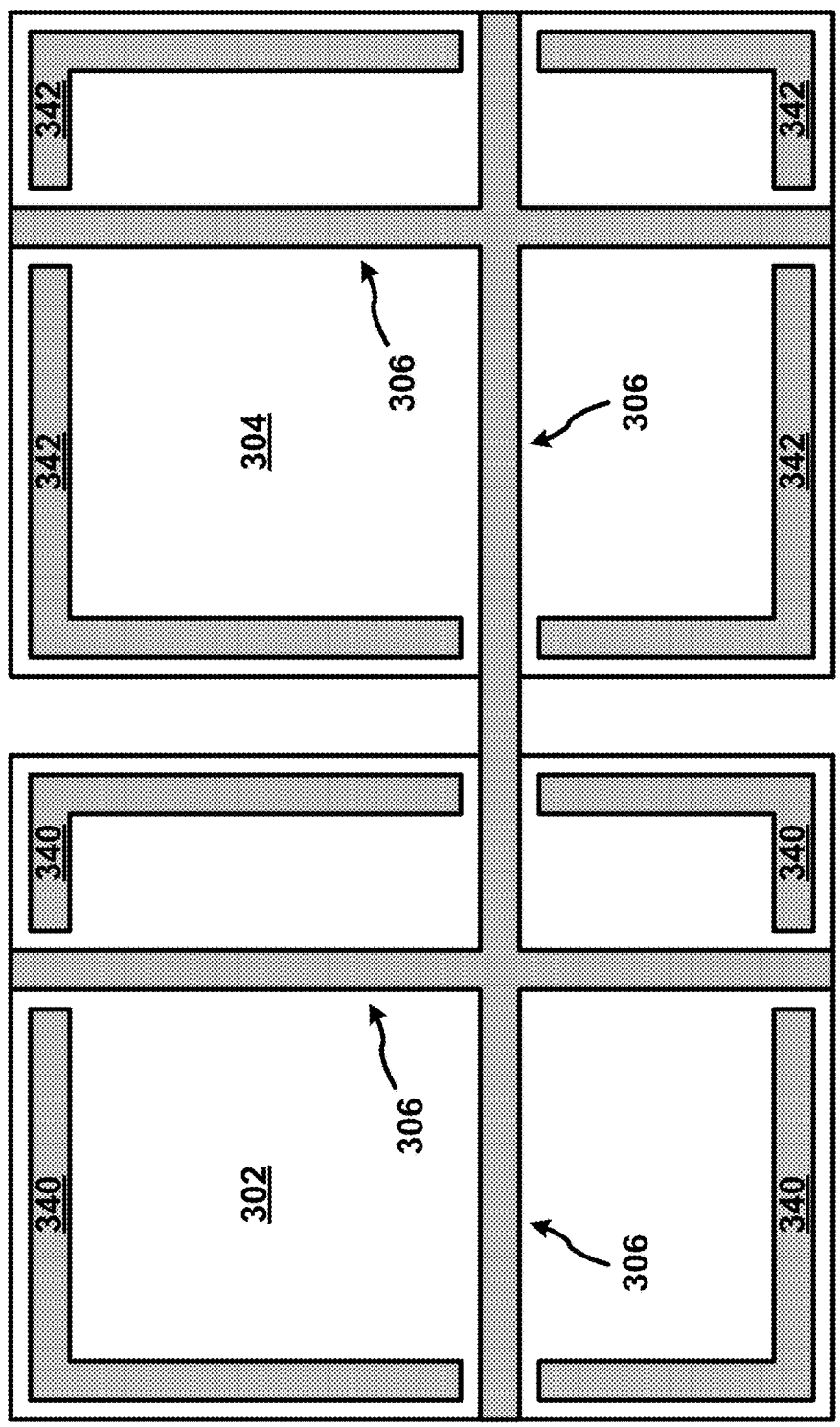
FIG. 3H illustrates a power bus crossing die seal rings between integrated circuit dies according to an embodiment of the present invention.

FIG. 3H illustrates a test IC die 302 coupled to an adjacent product IC die 304 by power bus 306. A single layer of metal is shown in the diagram. Test IC die 302 has a die seal ring 340 which substantially surrounds the circuitry therein. Similarly, product IC die 304 has a die seal ring 342 which also substantially surrounds the circuitry therein.

Die seal rings typically comprise a variety of layers (some in the silicon substrate plus all layers of metal and via connections). They are all electrically coupled together forming a continuous barrier around the edge of the die. The purpose is to prevent contamination from seeping into the die and creating corrosion damage. In practice, signals are rarely run across scribe lines between dies on a wafer to avoid this reliability issue. If inter-die signals across scribe lines are used in an application, precautions to avoid damage may be taken like, for example, the techniques described in U.S. Pat. No 7,224,042 to McCollum.

In order for power bus 306 to couple between test IC die 302 and product IC die 304, there must be a break on at least one metal layer in both die seal ring 340 and die seal ring 342 allowing power bus 306 to pass through and couple the two dies electrically. In order for multiple power busses 306 to couple between test IC die 302 and product IC die 304, a second layer must be used so that the power busses 306 can bridge over or under each other when their paths cross. Preferably, the breaks in die seal rings 340 and 342 are confined to a single layer, but that is a matter of design choice and breaks on multiple metal layers may be used.

Figure 3I:
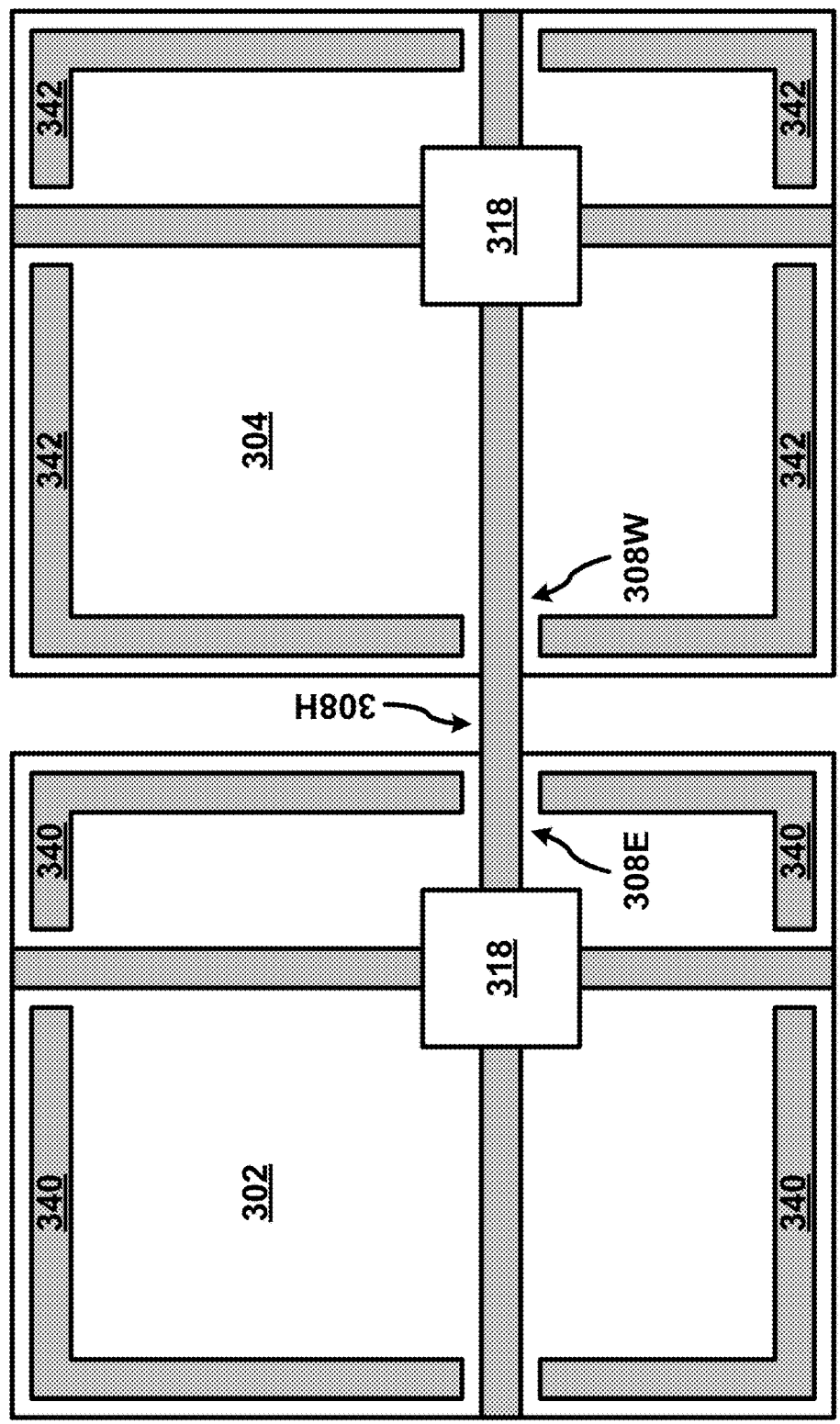
FIG. 3I illustrates a signal bus crossing die seal rings between integrated circuit dies according to an embodiment of the present invention.

FIG. 3I illustrates a test IC die 302 coupled to an adjacent product IC die 304 by signal bus 308H. A single layer of metal is shown in the diagram. As previously discussed, test IC die 302 has a die seal ring 340 and product IC die 304 has a die seal ring 342. The portion of signal bus 308H internal to test IC die 302 is 308E, while the portion of signal bus 308H internal to product IC die 304 is 308W. Here, the signal busses 308 span one IC die location, beginning and ending at a switch box 318.

In order for signal bus 308H to couple between test IC die 302 and product IC die 304, there must be a break on at least one metal layer in both die seal ring 340 and die seal ring 342 allowing signal bus 308H to pass through and couple the two dies electrically. In order for multiple horizontal signal busses 308H (or 308V for north-south signal busses) to couple between a test IC die 302 and a product IC die 304 (or between two product IC dies 304), a second metal layer must be used so that the power busses 306 can bridge over or under each other when their paths cross, preferably in switch box 318, although it may occur elsewhere in the dies. Preferably, the breaks in die seal rings 340 and 342 are confined to a single layer, but that is a matter of design choice and breaks on multiple metal layers may be used.

Figure 3J:
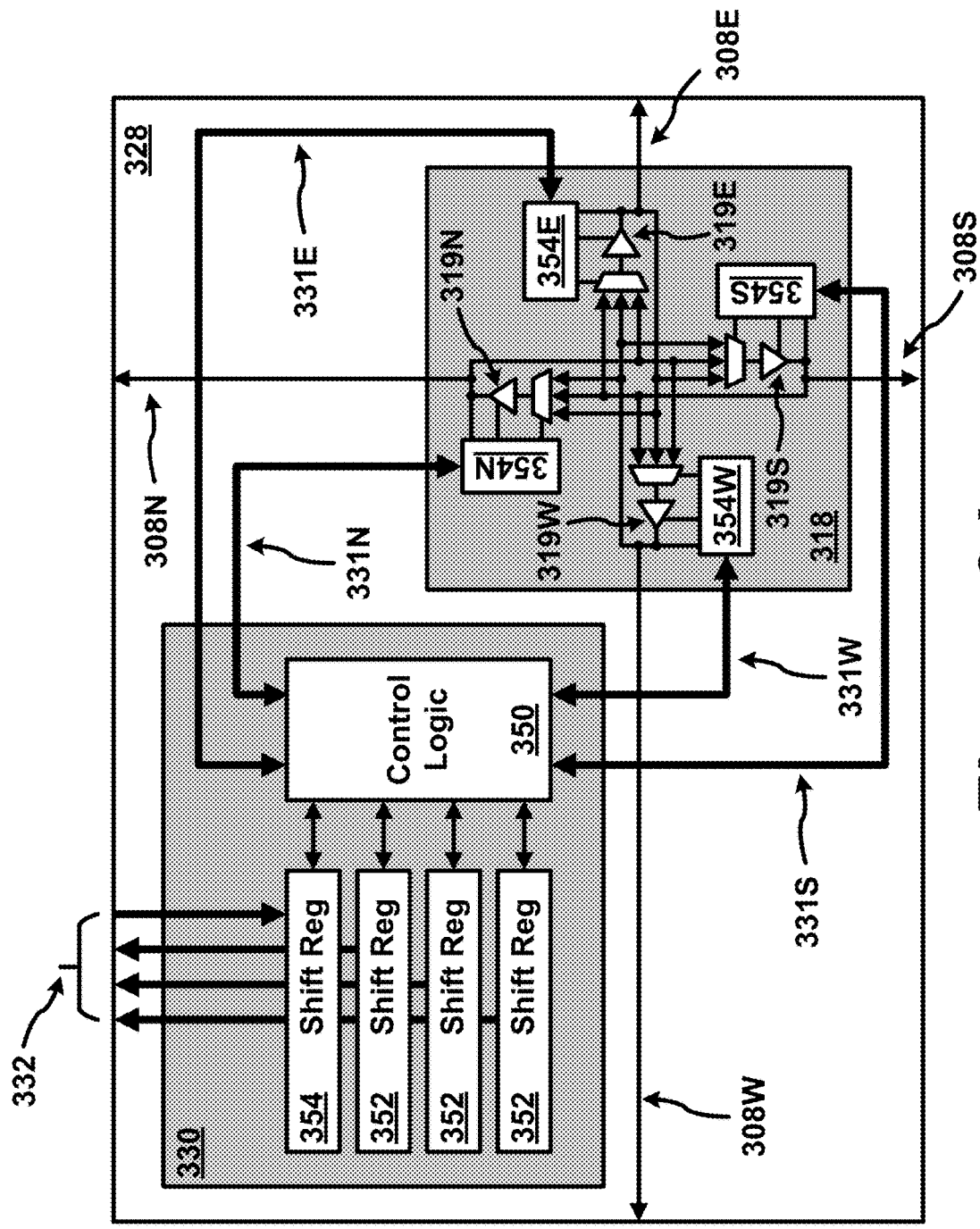
FIG. 3J illustrates more detail in the inter-die routing circuitry according to an embodiment of the present invention.

FIG. 3J illustrates more detail with regards to the coupling of a switch box 318 to interface circuit 330 in second routing circuit 328. There will typically be more than one switch box 318 in second routing circuit 328, but only one will be shown in the figure for clarity of presentation.

External connection bus 331 is shown broken into four sub-busses 331N, 331E, 331S and 331W coupled to the routing buffer control blocks 354N, 354E, 354S and 354W respectively. Routing buffer control blocks 354N, 354E, 354S and 354W are each further coupled to routing buffers 319N, 319E, 319S and 319W respectively. External connection sub-busses 331N, 331E, 331S and 331W are each further coupled to control logic 350 in interface logic 330.

In general, it is desirable to minimize the amount of inter-die conductors. Thus a serial communication method is preferably used, though other methods are possible. Serial busses can be implemented with as little as two wires: a clock signal and a data signal as known in the art. Other signals may be present with instances typically ranging from two to four.

Figure 3K:
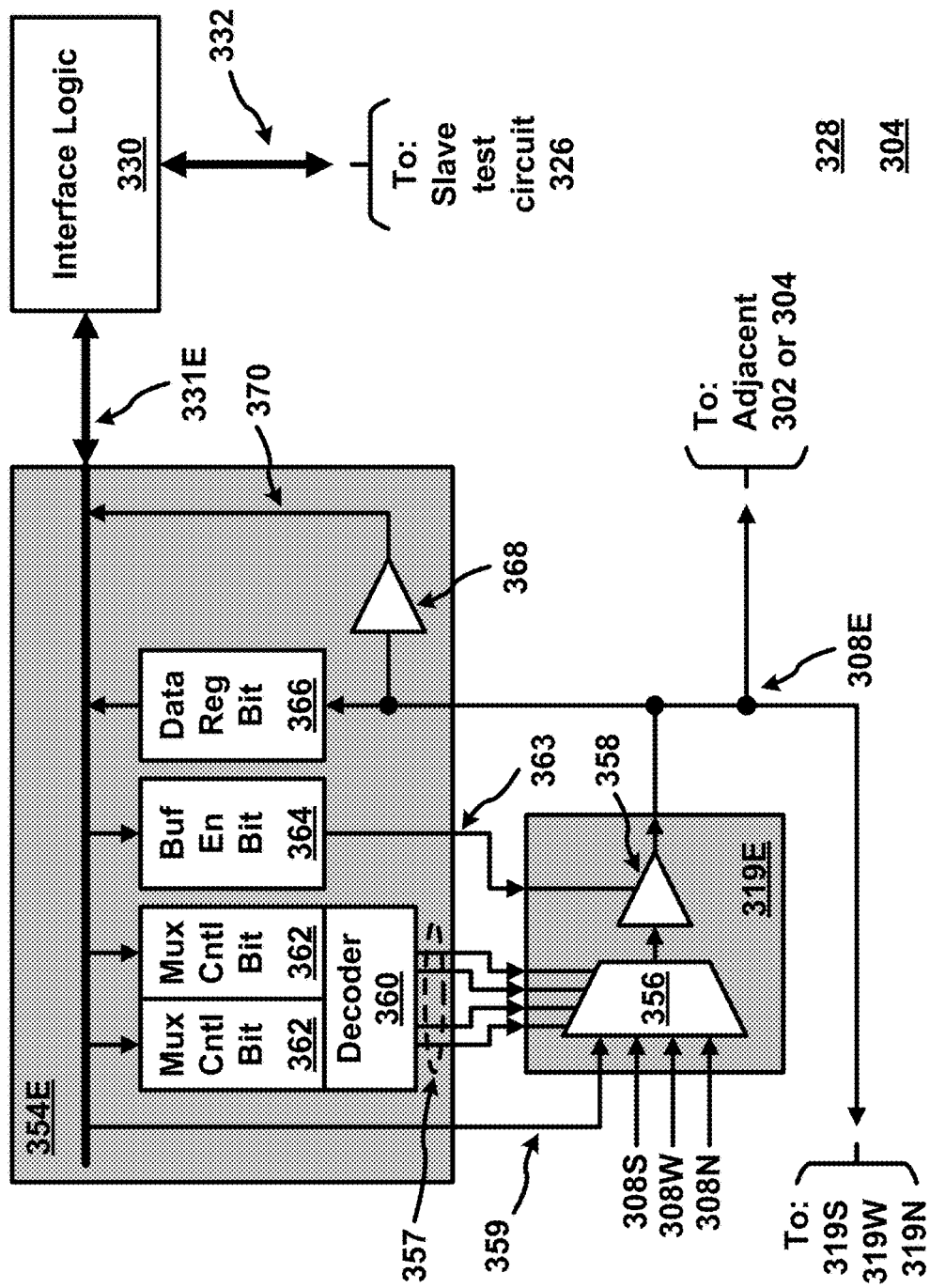
FIG. 3K illustrates more detail in the inter die routing circuitry according to an embodiment of the present invention.

FIG. 3K illustrates more detail with regards to the routing buffer control blocks 354 which are coupled to the routing buffers 319. In particular, routing buffer control block 354E is shown coupled to routing buffer block 319E, though the configurations of the north, south and west circuits will be the same, except for the directional changes in connectivity that depend on the side of the product IC die 304 the signal bus 308 crosses. All of the circuitry in the diagram is internal to second routing circuit 328 which itself is internal to product IC die 304.

Routing buffer 319E comprises 4:1 multiplexer 356 with a data output coupled to a data input of tri-state buffer 358. Tri-state buffer 358 has a data output coupled to signal bus 308E. Signal bus 308E is further coupled to multiplexer inputs of routing buffers 319S, 319W and 319N as shown in FIG. 3F, as well as to both an input of data register bit 366 and a data input of buffer 368 in routing buffer control block 354E.

The 4:1 multiplexer 356 has four input channels coupled to signal busses 308S, 308W, 308N and an external data line 359 (itself a portion of external data bus 331E). The first three inputs allow a signal coming into the product IC die 304 from the south, north and west on signal busses 308S, 308W and 308N respectively to be buffered and then routed to the next product IC die to the east. This allows directing the serial data along a programmed test path from one IC location (302 or 304). The fourth input allows data like, for example, results of a test performed on the main circuit 324 of the product IC die 304, to be sent from the interface logic circuit 330 to the second routing circuit 328 of the product IC die 304 to the east, or alternatively, to the first routing circuit of test IC die 302 if it is immediately to the east.

4:1 multiplexer 356 has four select lines 357, each one associated with and enabling each of the four input channels. Multiplexer 356 is exemplary and any appropriate 4:1 multiplexer implementation may be used. The select lines 357 couple between the four select inputs on multiplexer 356 and four outputs on 2:4 decoder 360. Decoder 360 has two inputs, each coupled to an output of the two multiplexer control bits 362 (also labeled "Mux Cntl Bit" in the figure). These bits determine which of the four channels of multiplexer 356 is gated to the input of tri-state buffer 358 where it can be transmitted onto signal bus line 308E if tri-state buffer 358 is enabled by means of buffer enable signal 363. Buffer enable signal 363 is coupled to an enable input of tri-state buffer 358 and an output of a first instance of buffer enable bit 364 (also labeled "Buf En Bit" in the figure).

This arrangement allows the routing of a test path from test IC die 302 through a series of product IC dies 304 and back to test IC die 302 to allow flexible testing of the product IC dies 304. It also allows the choice of multiple test paths and routing around a damaged product IC die 304 if necessary.

Signal bus 308E is further coupled to a data input of data register bit 366 and a data input of buffer 368. Buffer 368 also comprises an output coupled to data signal 370 (itself a portion of external bus 331E). Buffer 368 allows the interface logic 330 to monitor any signal waveforms for clock or data signals on signal bus 308E. Thus when powered up, interface logic may respond to commands that may eventually arrive from test IC die 302.

Persons skilled in the art will realize that the first test circuit 316 will be nearly identical to that of second routing circuit 328, except for differences in the interface logic 320 necessary for master test circuit 314 to control first test circuit 316 directly. Such logic design differences are well within the capabilities of one skilled in the art after reading and understanding this disclosure. Such skilled persons will realize that there are many ways that such a logic design may be implemented and that the embodiment described in FIGS. 3A through 3K is exemplary only and in no way limiting.

Referring to both FIG. 3J and FIG. 3K, the operation of second routing circuit 328 will be described. The first priority is to determine the functionality of a test path forming a loop from test IC die 302 through a preferred group of continuous product IC dies 304 and back to test IC die 302—preferably returning from a different side, but other options are possible as a matter of design choice.

The first command will typically verify the functionality of second routing circuit 328 and slave test circuit 326. If they are functional, the routing buffers will be programmed to direct the signal to the next product IC die 304 in the test path. The programming involves setting the values of the two mux control bits 362 and the buffer enable bit 364 in each of the routing buffer control blocks in each of the switch boxes 318 in the second routing control circuit 328.

This process will proceed on to the next product IC die 304 in the desired test path. If a failure occurs, the external tester in conjunction with master test circuit 314 in test IC die 302 will have to determine an alternate route by trial-and-error. Since product IC dies 304 are small enough to not lend themselves to direct probing, the failure rate should be very low and little trial-and-error rerouting is expected.

Once the test path routing is complete, then functional testing of main circuit 324 by slave test circuit 326 may begin. This can occur in one, some, or all of the product IC dies 304 in the test path. Typically, this will occur by shifting at test command and associated data into one or more shift registers 352 which provide slave test circuit 326 with the instructions and data needed to run built-in self-test on main circuit 324. The results may then be captured in a shift register 354 for transmission along the test path, eventually being sent to the external tester by way of test IC die 302.

Figure 4A:
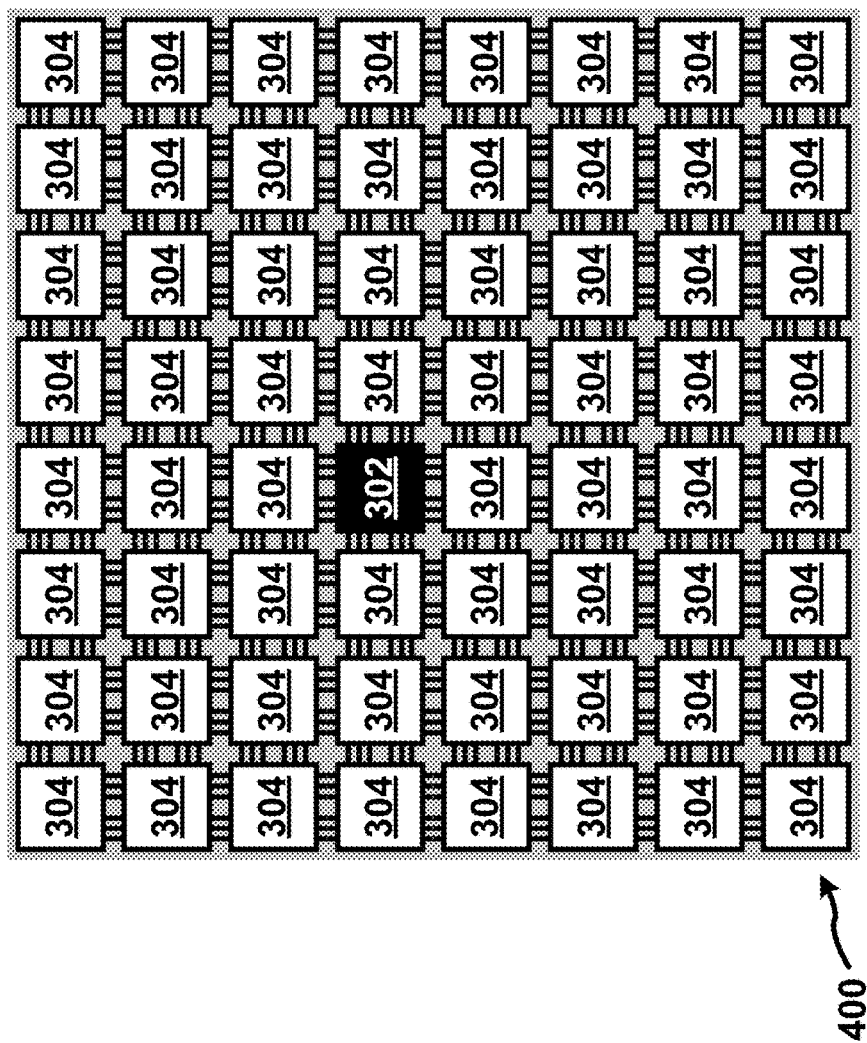
FIG. 4A illustrates a region of integrated circuit locations defined by a mask reticle according to an embodiment of the present invention.

FIG. 4A illustrates an array of IC die locations that fit within a mask reticle area 400. The array in mask reticle area 400 comprises a single test IC die 302 and a plurality of product IC die locations 304. Although test IC die 302 is preferably located near the center of the mask reticle area 400, another location may be chosen as a matter of design choice. In some embodiments, there may be a plurality of instances of test IC die 302 present within the mask reticle area 400.

Figure 4B:
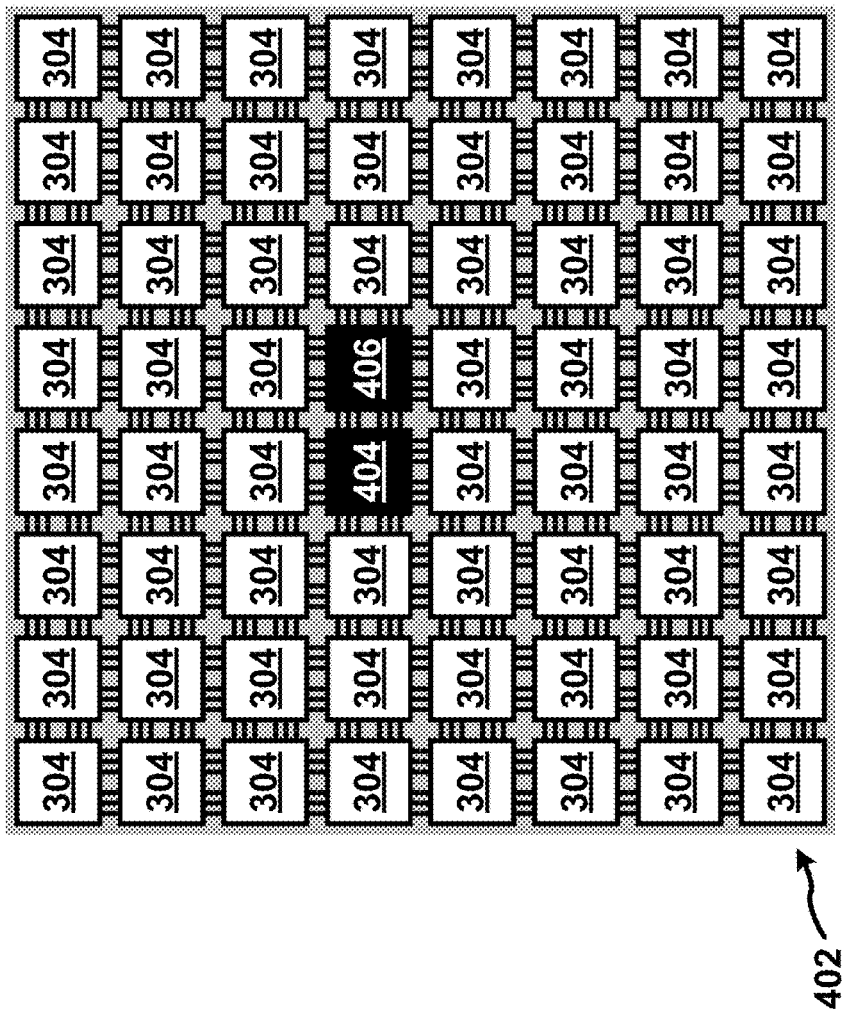
FIG. 4B illustrates a region of integrated circuit locations defined by a mask reticle according to an embodiment of the present invention.

FIG. 4B illustrates an array of IC die locations that fit within a mask reticle area 402. The array in mask reticle area 402 comprises two test IC dies 404 and 406, and a plurality of product IC die locations 304. Although test IC dies 404 and 406 are preferably located near the center of the mask reticle area 402, another location may be chosen as a matter of design choice.

Test dies 404 and 406 comprise two portions of a master test circuit that is too large for a single test IC die like 302 in mask reticle area 400. All power busses 306 pass through test IC dies 404 and 406 forming a mesh. Preferably test dies 404 and 406 comprise one first routing circuit 316 at one product IC die location and a second routing circuit 328 at all the others. All signal busses 308H and 308V are coupled to the respective routing circuits in dies 404 and 406 in a manner analogous to that described in conjunction with test IC die 302 and product IC dies 304 in FIGS. 3A through 3K. If the product IC dies are sufficiently small, two or more product IC die locations 304 may be used to provide sufficient area for the required number of probe pads to test all product IC die 304 in mask reticle area 402.

Figure 4C:
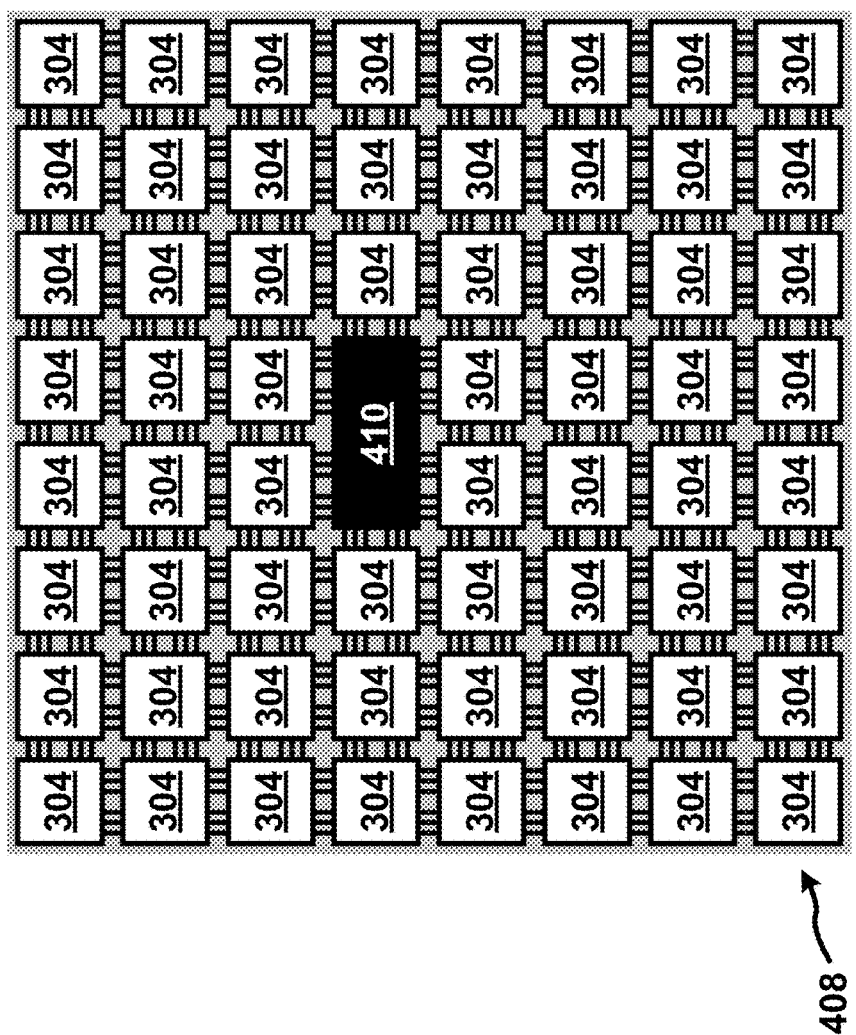
FIG. 4C illustrates a region of integrated circuit locations defined by a mask reticle according to an embodiment of the present invention.

FIG. 4C illustrates an array of IC die locations that fit within a mask reticle area 408. The array in mask reticle area 402 comprises a test IC die 410, and a plurality of product IC die locations 304. Although test IC die 410 is preferably located near the center of the mask reticle area 402, another location may be chosen as a matter of design choice and multiple instances of test IC die 410 may be present.

Test die 410 comprises a master test circuit that is too large for a single test IC die like 302 in mask reticle area 400. All power busses 306 pass through test IC die 410 forming a mesh. Preferably test die 410 comprises a routing circuit for each IC die location and all signal busses 308H and 308V are coupled to the respective routing circuits in dies 410 in a manner analogous to that described in conjunction with test IC die 302 and product IC dies 304 in FIGS. 3A through 3I. More than two IC die locations may be used for test IC die 410. If the product IC dies are sufficiently small, two or more product IC die locations 304 may be used to provide sufficient area for the required number of probe pads to test all die 304 in mask reticle area 408.

Figure 4D:
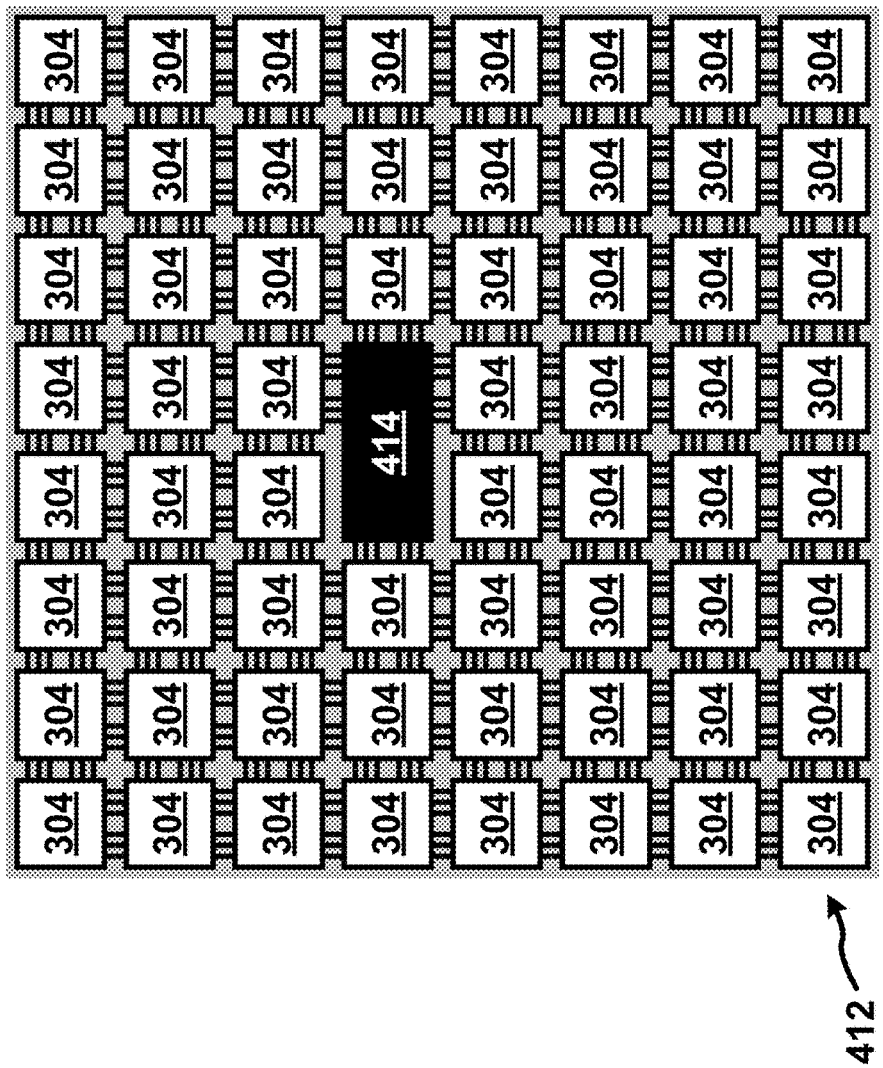
FIG. 4D illustrates a region of integrated circuit locations defined by a mask reticle according to an embodiment of the present invention.

FIG. 4D illustrates an array of IC die locations that fit within a mask reticle area 412. The array in mask reticle area 412 comprises a test IC die 414, and a plurality of product IC die locations 304. Although test IC die 414 is preferably located near the center of the mask reticle area 412, another location may be chosen as a matter of design choice and multiple instances of test IC die 414 may be present.

Test die 414 comprises a master test circuit that is too large for a single test IC die like 302 in mask reticle area 400. Not all power busses 306 or signal busses 308H or 308V pass through every IC die location in test IC die 414. Note the discontinuities in these busses on the north and south sides in the west half of test IC die 414. In such cases, a routing circuit may not be present in such a die location.

More than two IC die locations may be used for test IC die 414. If the product IC dies are sufficiently small, two or more product IC die locations 304 may be used to provide sufficient area for the required number of probe pads to test all die 304 in mask reticle area 412.

In FIGS. 4A through 4D the power busses 306 and the signal busses 308H and 308V do not exit the mask reticle areas 400, 402, 408 and 412 respectively. Thus the array in each reticle is independent for test purposes.

Figure 4E:
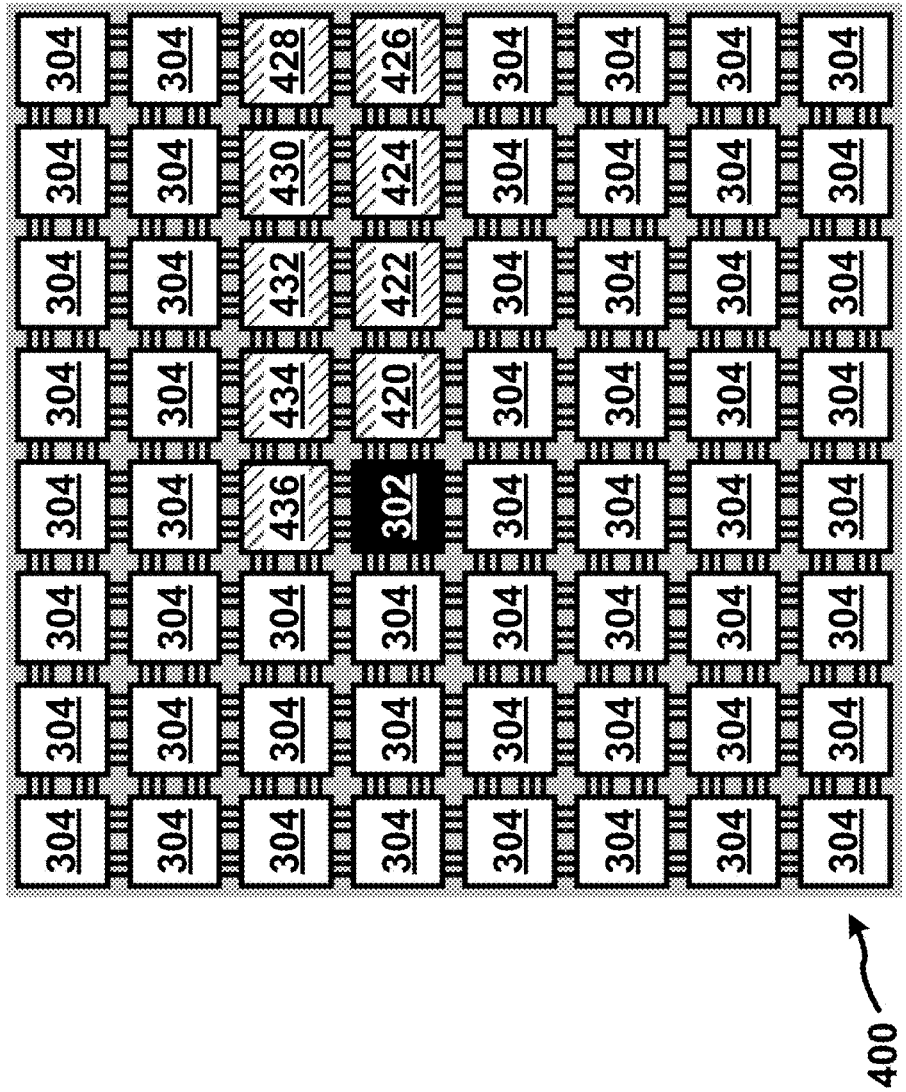
FIG. 4E illustrates a test path according to an embodiment of the present invention.

FIG. 4E illustrates an exemplary test path in the array in mask reticle area 400 from FIG. 4A. The signals on busses 308H and 308V are used to program a test path starting on the east side of test IC 302, passing through product IC dies 304 labeled 420, 422, 424, 426, 428, 430, 432, 434 and 436 before returning to the north side of test IC 302. Preferably a serial protocol like, for example, JTAG, I2C, I3C, SPI, a single wire scheme, etc., is used, but other schemes may be employed as a matter of design choice.

After the probes (not shown) contact the power probe pads 310 and the signal probe pads 312 on test IC die 302, the external tester (not shown) runs a diagnostic to determine if master test circuit 314 and first routing circuit 316 are functional. If not, the product IC dies 304 in mask reticle area 400 cannot be tested. Thus in some embodiments two or more test IC die 302 may be placed in the mask reticle for redundancy. In such cases, the probe card may be moved to the alternative test IC die 302, the probes lowered to the probe pads 310 and 312, and the testing proceeds as usual. The number and location of such multiple instances is a matter of design choice. Multiple test IC die 302 instances can also speed up testing if both may be probed simultaneously allowing two or more sections of the mask reticle area die locations to be tested in parallel. Similarly, a single or multiple number of test IC die 302 instances may be probed simultaneously in more than one reticle.

If master test circuit 314 and first routing circuit 316 in test IC die 302 are functional, then the second routing circuits 328 in succession are diagnosed and programmed to route along the desired path. The signals are routed through the product IC locations 304 labeled 420, 422, 424, 426, 428, 430, 432, 434 and 436 in order in this example, though a different order or test path may be used. The second routing circuits 328 are configured one at a time until the test path looping back to test IC die 302 is complete.

Once the routing of the test path is complete test IC die 302 can run functional tests on the product IC dies 304 in the test path. The product IC dies 304 may be tested one at a time, in groups, or all at once as a matter of design choice. The results of the tests are returned along the test path to test IC die 302 which may process the data before it returns them to the external tester. When all of the product IC dies 304 in the test path have been tested, the external tester then uses test IC die 302 to program another test path and testing proceeds for the product IC dies in that test path. When testing for each test path is complete, the testing proceeds to the next test IC die (or dies) 302. The tester logs all of the test results and creates a map of all the functional product IC dies 304 on the entire silicon wafer. This map is then used to identify the functional product IC dies 304 after the wafer is scribed into individual dies.

Figure 4F:
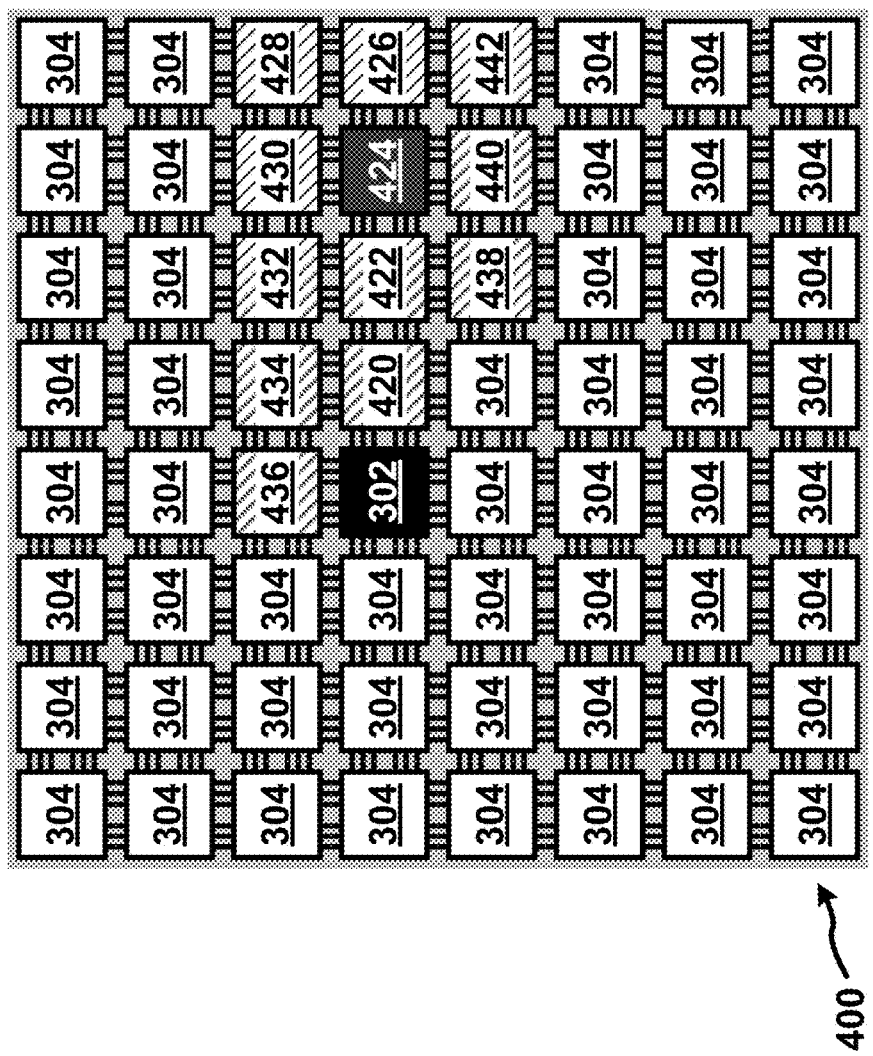
FIG. 4F illustrates a test path avoiding an integrated circuit die location with a malfunctioning routing circuit according to an embodiment of the present invention.

FIG. 4F illustrates an exemplary test path in the array in mask reticle area 400 with a defective second routing circuit 328 in product IC die 304 at the location labeled 424. In this case, the test path starting on the east side of test IC 302, passing through product IC dies 304 labeled 420, 422, 424, 426, 428, 430, 432, 434 and 436 before returning to the north side of test IC 302 is unavailable.

Instead, the external tester and/or test IC die 302 analyses the location of the defect and creates an alternate routing test path. In this example, the test path starts on the east side of test IC 302, passing through product IC dies 304 labeled 420, 422, 438, 440, 442, 426, 428, 430, 432, 434 and 436 before returning to the north side of test IC die 302. Persons skilled in the art will realize that many alternate test paths are possible. Such skilled persons will also realize that the main circuits 314 of new product IC dies 304 in the rerouted test path (438, 440 and 442) may be tested with this test path or in their turn as part of their originally planned test path. This illustrates that a product IC die 304 may be used for routing without testing its main circuit 314.

In some embodiments, there may be circuitry on a product IC die 304 that requires some tuning or trimming in order to operate within specification. In such circumstances, one or more non-volatile element like, for example, EEPROM, fuses or blown transistor gate oxide regions, etc., may be present. In such cases, a power bus 306 may be used to provide a programming voltage [Vpp]. Programming circuitry in slave test circuit 326 may be used to apply the programming voltage to the non-volatile element to program it.

Figure 5:
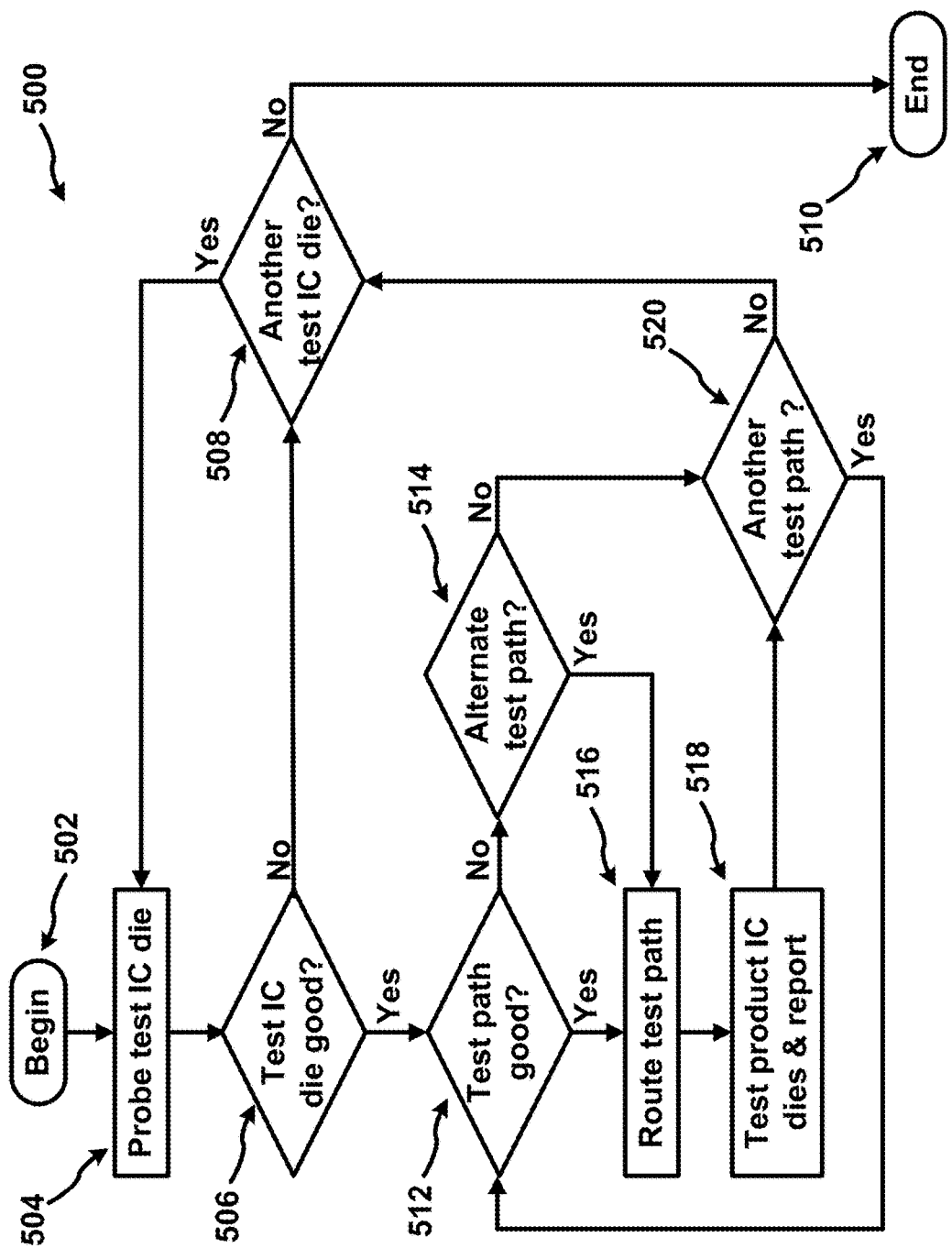
FIG. 5 illustrates a flow chart depicting a method of operation according to an embodiment of the present invention.

FIG. 5 illustrates a flow chart 500 of a method for testing according to the present invention. At step 502, the testing begins when the wafer to be tested is placed into a test apparatus like, for example, placing the wafer 300 onto a chuck in a wafer prober coupled to an automated tester and the test program is activated, though any appropriate test apparatus may be used. Such tests are typically automated and controlled by a hardware executable sequence of computer readable instructions in a computer memory coupled to a processor internal to the automated tester. The sequence of computer readable instructions (also known as the test software or the test program, etc.) may be stored internal to the automated tester or in some other data storage device like, for example, a hard disk drive, a solid state drive, etc. The test program then proceeds to step 504.

At step 504, the probes are physically connected to the first test IC die 302, typically by placing a probe card with multiple probes over the probe pads and then lowering the probe card until all probes make good electrical connections to test IC die 302. The test program then proceeds to step 506.

At step 506, the test apparatus runs a diagnostic to determine if the first test IC die 302 is functional. If it is functional, the test program proceeds to step 512, else the test program labels the product IC dies that would normally be tested by test IC die 302 as "orphans" and the test program proceeds to step 508.

At step 508, the test program determines if there is a second test IC die 302 that has not yet been probed. If there is, then the test program returns to step 504, else the testing is complete and the test program proceeds to step 510 and ends.

After returning to step 504 and probing second test IC die 302 and then successfully determining the functionality of the second test IC die 302 in step 506, the test program determines if the second test IC die 302 has routing access to any product IC dies 304 labeled orphans (e.g., because it is part of the same reticle location as the failed first test IC die 302). If it is, then a recovery routine will be run to utilize second IC die 302 to test the orphan product IC dies 304 that would normally have been tested by the first test IC die 302. Testing the orphans comprises creating and routing alternate test paths to the orphaned product IC dies 304 from the second test IC die 302 and then testing them. This may be accomplished by including the additional orphan test routes along with the regular planned test routes within the test procedure comprising steps 512, 514, 516, 518 and 520.

At step 512, the testing of a planned set of test paths begins. The routing of a first test path is verified to be functional. If it is, then the test program proceeds to step 516, else it proceeds to step 514.

At step 514, a search is conducted to see if an alternative test path is available. If it is, then the test program proceeds to step 516, else it proceeds to step 520.

At step 516, the test path is routed. The test program then proceeds to step 518.

At step 518, the test commands and data are shifted into the product IC dies 304. The product IC dies 304 are tested for functionality and the data is reported back to the external tester via test IC die 302. The test program proceeds to step 520.

At step 520, a search is conducted to see if another planned or alternate test path exists. If it does, then the test program proceeds to step 512, else it proceeds to step 508.

Thus the test program systematically proceeds through all of the test IC dies 302. For each it proceeds through all of the planned test paths as well as any alternate test paths in the same reticle that may arise due to bad or orphaned product IC dies 304.

In the exemplary embodiments above, a rectangular product IC die (or chiplet) has been assumed. For very tiny chiplets, traditional wafer sawing is impractical because scribe lines wide enough to accommodate a wafer saw may be too wide relative to the chiplet dimensions to be area efficient. Thus plasma dicing is used to simultaneously separate all of the dies instead of sawing along scribe lines one at a time.

If plasma dicing is used, there is no need for the dies to be rectangular. Thus, for example, a hexagonal shaped chiplet is practical since scribe lines no longer need to be straight all the way across a wafer. In such a case, there would be three different directions that power busses 306 or signal busses 308 could run. The same basic principles apply: each test IC die and each product IC die will have a routing circuit coupled to the routing circuit in each of its six adjacent neighbors. Thus the testing of chiplets in any practical array of non-rectangular shapes falls within the scope of the present invention.

Those of ordinary skill in the art will realize that the above figures and descriptions are exemplary only. Many other embodiments will readily suggest themselves to such skilled persons after reviewing this disclosure. Thus the invention is not to be limited in any way except by the issued claims.

What is claimed is:

1. A semiconductor wafer, comprising:
   (A) a region comprising a plurality of integrated circuit die locations organized in rows and columns;
   (B) first scribe lines separating the rows of integrated circuit die locations;
   (C) second scribe lines separating the columns of integrated circuit die locations;
   (D) a test integrated circuit die occupying at least one of the integrated circuit die locations, the test integrated circuit die comprising:
      (i) a plurality of probe pads,
      (ii) a master test circuit coupled to the probe pads, and
      (iii) a first routing circuit coupled to the master test circuit, wherein the first routing circuit is configured to be coupled to a routing circuit in at least one adjacent integrated circuit die location;
   (E) a plurality of product integrated circuit dies each occupying one of the integrated circuit die locations, each product integrated circuit die comprising:
      (i) a second routing circuit that is configured to be coupled to at least one routing circuit in an adjacent integrated circuit die location,
      (ii) a slave test circuit coupled to the second routing circuit, and
      (iii) a main circuit coupled to the slave test circuit;
   (F) one or more first conductors configured to electrically couple signals across at least one scribe line between the first routing circuit and the second routing circuit; and
   (G) a plurality of second conductors configured to electrically couple at least two power voltage levels across at least one scribe line.

2. The semiconductor wafer of claim 1, wherein:
   (i) the master test circuit is coupled to each of the slave test circuits in the region through the first routing circuit, a portion of the one or more first conductors, and the plurality of second routing circuits,
   (ii) the master test circuit controls the first routing circuit and the second routing circuits to couple the slave test circuits to the master test circuit in a specific sequence, and
   (iii) the master test circuit controls the slave test circuits to perform functional tests on the main circuits.

3. The semiconductor wafer of claim 2, wherein:
   each product integrated circuit die further comprises at least one non-volatile programmable control element.

4. The semiconductor wafer of claim 3, wherein:
   (i) the master test circuit controls the slave test circuit to program the non-volatile programmable control elements on a particular product integrated circuit die, and
   (ii) the test integrated circuit die provides a programming voltage through a portion of the second conductors to the slave test circuit on the particular product integrated circuit die during programming.

5. The semiconductor wafer of claim 4, wherein:
the non-volatile programmable elements are one-time programmable.

6. The semiconductor wafer of claim 5, wherein:
the region is defined by a mask reticle location.

7. The semiconductor wafer of claim 2, wherein:
the region is defined by a mask reticle location.

8. The semiconductor wafer of claim 1, wherein:
the region is defined by a mask reticle location.

* * * * *